(12) United States Patent
Orio

(10) Patent No.: US 7,467,347 B2
(45) Date of Patent: Dec. 16, 2008

(54) METHOD FOR DECODING ERROR CORRECTING CODE, ITS PROGRAM AND ITS DEVICE

(75) Inventor: Masao Orio, Kanagawa (JP)

(73) Assignee: NEC Electronics Corporation (JP)

( * ) Notice: Subject to any disclaimer, the term of this patent is extended or adjusted under 35 U.S.C. 154(b) by 720 days.

(21) Appl. No.: 10/641,563

(22) Filed: Aug. 15, 2003

(65) Prior Publication Data

US 2004/0039769 A1 Feb. 26, 2004

(30) Foreign Application Priority Data

Aug. 20, 2002 (JP) ............................. 2002-239492

(51) Int. Cl.
*H03M 13/41* (2006.01)
(52) U.S. Cl. .................. 714/792; 714/795; 714/796
(58) Field of Classification Search ............... 714/780, 714/792, 795, 796
See application file for complete search history.

(56) References Cited

U.S. PATENT DOCUMENTS

| | | | | |
|---|---|---|---|---|
| 5,185,747 A | * | 2/1993 | Farahati ................... | 714/795 |
| 5,933,462 A | * | 8/1999 | Viterbi et al. .............. | 375/341 |
| 6,393,076 B1 | * | 5/2002 | Dinc et al. ................. | 375/341 |
| 6,477,681 B1 | * | 11/2002 | Taipale et al. .............. | 714/795 |
| 6,510,536 B1 | * | 1/2003 | Crozier et al. .............. | 714/755 |
| 6,718,504 B1 | * | 4/2004 | Coombs et al. ............. | 714/755 |
| 6,732,327 B1 | * | 5/2004 | Heinila .................... | 714/792 |
| 6,775,801 B2 | * | 8/2004 | Wolf et al. ................. | 714/755 |
| 6,865,712 B2 | * | 3/2005 | Becker et al. .............. | 714/796 |
| 6,996,765 B2 | * | 2/2006 | Wolf et al. ................. | 714/755 |
| 2002/0007474 A1 | * | 1/2002 | Fujita et al. ................ | 714/755 |
| 2002/0015457 A1 | * | 2/2002 | Obuchi et al. .............. | 375/340 |
| 2002/0095640 A1 | * | 7/2002 | Arad et al. ................. | 714/792 |
| 2002/0118777 A1 | * | 8/2002 | Blankenship et al. ....... | 375/341 |
| 2003/0084398 A1 | * | 5/2003 | Nguyen ..................... | 714/786 |
| 2003/0097630 A1 | * | 5/2003 | Wolf et al. ................. | 714/755 |

FOREIGN PATENT DOCUMENTS

| | | |
|---|---|---|
| JP | 2000-278144 | 10/2000 |
| JP | 2002-217745 | 8/2002 |
| WO | WO 01/54286 | 9/2001 |
| WO | WO 02/33834 | 4/2002 |

OTHER PUBLICATIONS

"A Parallel MAP Algorighm for Low Latency Turbo Decoding" Yoon et al., IEEE Comminications Letters, vol. 6, No. 7, Jul. 2002, pp. 288-290.

(Continued)

*Primary Examiner*—Stephen M Baker
(74) *Attorney, Agent, or Firm*—Hayes Soloway P.C.

(57) ABSTRACT

A decoding method is provided which is capable of achieving decoding of error correcting codes in a simple configuration and in a short time. In the method of decoding error correcting codes to perform iterative decoding which consists of forward processing, backward processing, and extrinsic information value calculating, a backward processing path metric value obtained in the previous decoding iteration for a window boundary is used as an initial value of the backward processing path metric value for the window boundary in the next decoding iteration.

16 Claims, 15 Drawing Sheets

OTHER PUBLICATIONS

"Improving the Max-log-MAP Turbo Decoder" Vogt et al., Electronics Letters, vol. 36, No. 23, Nov. 9, 2000.
"A DSP-Based Implementaion of a Turbo-Decoder" Blazek et al, IEEE vol. 5, 1998, pp. 2751-2755.
"State Vector Reduction for Initalizatio of Sliding Windows MAP" Dielissen et al., 2nd International Symposium on Turbo Codes & Related Topics, 2000, pp. 387-390.
"Soft-Output Decoding Algorithms for Continuous Decoding of Parallel Concatenated Convolutional Codes" Benedetto et al Proceeding of IEEE International Conference on Communications, pp. 112-117, 1996.
"VLSI Architectures for Turbo Codes" Masera, IEEE Transactions on VLSI System, pp. 369-379, 1999.
"An Intuitive Justification and a Simplified Implementation of the MAP Decoder for Convolutional Codes" Viterbi, IEEE Journal on Selected Areas on Communications, pp. 260-264, 1998.

* cited by examiner

METHOD FOR DECODING ERROR CORRECTING CODE, ITS PROGRAM AND ITS DEVICE

BACKGROUND OF THE INVENTION

1. Field of the Invention

The present invention relates to a method for decoding error correcting codes, a program storing the method for decoding error correcting codes, and a device for the method for decoding error correcting codes and more particularly to the method for decoding error correcting codes that can be used suitably for digital mobile communications systems such as a portable cellular phone or a like and the program of the decoding method and the device for the decoding method.

The present application claims priority of Japanese Patent Application No. 2002-239492 filed on Aug. 20, 2002, which is hereby incorporated by reference.

2. Description of the Related Art

Recently, as an error correcting code, Turbo codes that can realize, by performing realistic processing, a transmission characteristic being near to a limit of information theory (being called a "Shannon's limit") have been developed. The Turbo codes are described below.

FIG. 17 is a schematic diagram of a conventional encoder to produce Turbo codes being one of PCCCs (Parallel Concatenated Convolutional Codes). As shown in FIG. 17, the encoder of the example is so configured that two pieces of convolutional encoders 1 and 2 are concatenated in parallel through an interleaving device 3. The convolutional encoder 1 encodes a first parity bits "p" using an information sequence (systematic bits "u") to be fed from an outside. The interleaving device 3 produces interleaved systematic bits "u'" obtained by sorting each bit of the systematic bits "u". This processing is called as "interleaving". This interleaving device 3 feeds it to the convolutional encoder 2. The convolutional encoder 2 encodes a second parity bits "p'" using the interleaved systematic bits "u'". A set of the systematic bits "u" and the first parity bits "p" is called a first element code (u, p) and a set of the interleaved systematic bits "u'" and the second parity bits "p'" is called a second element code (u', p').

On the other hand, a method for decoding the Turbo codes is featured in that the decoding is iterated while a priori probability being reliable information is exchanged between the first element code (u, p) decoding and the second element code (u', p') decoding. The method for decoding the Turbo codes employs a soft-input and soft-output decoding method. The soft-input and soft-output decoding method can be roughly classified into two methods, one being a SOVA (Soft-Output Viterbi Algorithm) decoding method and another being a MAP (Maximum A-Posteriori) decoding method. A Max-Log-MAP algorithm being one type of the MAP decoding method is described below. In the Max-Log-MAP algorithm, the Viterbi decoding is performed on a trellis diagram to calculate a Path Metric.

FIG. 18 is a trellis diagram. FIG. 19 is a diagram of a procedure of ordinary decoding. Processing in which the Viterbi decoding is performed from a start point to an end point on the trellis diagram to calculate a path metric value is called "forward processing" and the path metric value calculated with the forward processing is called an "α" path metric value (αPMor first path metric value). The α path metric value is stored in a memory as shown in FIG. 19. On the other hand, processing in which the Viterbi decoding is performed in a direction being reverse to the direction employed in the forward processing to calculate a path metric value is called "backward processing" and the path metric value is called a "β" path metric value (β PMor second path metric value). Moreover, processing in which Log-Likelihood Ratio (LLR) (Logarithm ratio of a posteriori probability) is calculated from the α path metric value, the β path metric value and a branch metric value and then extrinsic information is calculated is called "extrinsic information value calculating". Here, the extrinsic information value represents an increment of reliability for information sequence. The extrinsic information value is actually used as a priori probability to be exchanged between the first element code (u, p) decoding and the second element code (u', p') decoding.

Next, the Max-Log-MAP algorithm is explained in detail. First, an output of the convolutional encoder occurring at time k, since it is a systematic code, is set to be $(u_k, p_k) \in \{\pm 1\}$ ($p_k$ being a parity bits) and a corresponding input of the convolutional decoder $y_k$ is set to be $(y_k^u, y_k^p)$. Estimated information sequence $u_{hk}$ is set to be $(u_h1, u_{h2}, \ldots u_{hN})$. FIG. 20 is a diagram of a transition model in a case when a transition from a time point (k−1) to a time point k on the trellis diagram takes place. When a specified state on the trellis diagram at the time k is defined to be a state $S_K$ and a specified state on the trellis diagram at time (k−1) is defined to be a state $s_{K-1}$, Log-Likelihood Ratio L ($u_{hk}$) in the Max-Log-MAP algorithm is given by equation (1).

$$L(u_{hk}) = \max_{\substack{(s_{k-1}, s_k) \\ u_k = +1}} \{lnp(s_{k-1}, s_k, y)\} - \max_{\substack{(s_{k-1}, s_k) \\ u_k = -1}} \{lnp(s_{k-1}, s_k, y)\} \quad \text{Equation (1)}$$

In equation (1), "p ($s_{K-1}$, $s_K$, y)" denotes concurrent occurrence probability for an input "y" of the convolutional decoder and a transition from the state $s_{K-1}$ to the state $s_K$. That is, the pre-defined information L ($u_{hK}$) of a k-th information bit $u_K$ is defined as a difference between a maximum probability out of the concurrent occurrence probability p($s_{K-1}$, $s_K$, y) for all the transitions ($s_{K-1} \rightarrow s_K$) that take place due to $u_K$=+1 and a maximum probability out of the concurrent occurrence probability p($s_{K-1}$, $s_K$, y) for all the transitions ($s_{K-1} \rightarrow s_K$) that take place due to $u_K$=−1. When an input of the convolutional decoder to be supplied during time "i" to time "j" is expressed by equation (2) and when a codeword length is N, the concurrent occurrence probability p $s_{K-1}$, $s_K$, y) in a memoryless channel is given as a sum of independent probability expressed by equation (3).

$$Y_i^j = (y_i, y_{i+1}, \ldots, y_j) \quad \text{Equation (2)}$$

$$p(s_{k-1}, s_k, y) = p(s_{k-1}, Y_1^{k-1}) + p(s_k, y_k | s_{k-1}) + p(Y_k^N | s_k) \quad \text{Equation (3)}$$

In equation (3), each term of a right side is expressed in order from the left respectively as $\alpha_{K-1}(s_{K-1})$, $\gamma_k(s_K, s_{K-1})$ and $\beta_k(s_K)$. Out of them, $\gamma_k(s_K, s_{K-1})$ is a branch metric value for all the existing transitions ($s_{K-1} \rightarrow s_K$). $\alpha_{K-1}(s_{K-1})$ is a path metric value calculated by the forward processing and $\beta_k(s_K)$ is a path metric value calculated by the backward processing, each of which can be recursively calculated by equations (4) and (5).

$$\alpha_k(s_k) = \max_{s_{k-1}} \{\gamma_k(s_{k-1}, s_k) + \alpha_{k-1}(s_{k-1})\} \quad \text{Equation (4)}$$

$$\beta_{k-1}(s_{k-1}) = \max_{s_k} \{\gamma_k(s_{k-1}, s_k) + \beta_k(s_k)\} \quad \text{Equation (5)}$$

FIG. 21 is a diagram of a model of calculating $\alpha_{K-1}(s_K-1)$, $\gamma_k(s_K, s_K-1)$ and $\beta_k(s_K)$ in a case where a transition from the time (k−1) to the time k on the trellis diagram takes place.

However, the start and end points on the trellis diagram are unique and are initialized as shown in equation (6).

$$\alpha_0(s_0) = \begin{cases} 1, & \text{if } s_0 = 0, \\ 0, & \text{if } s_0 \neq 0. \end{cases} \quad \beta_N(s_N) = \begin{cases} 1, & \text{if } s_N = 0, \\ 0, & \text{if } s_N \neq 0. \end{cases} \quad \text{Equation (6)}$$

Moreover, an extrinsic information value can be calculated by using equation (7) and equation (8) from the pre-defined information L ($u_{hK}$).

$$L_i(u_k) = L_a(u_k) + L_c \times y_k^u \quad \text{Equation (7)}$$

$$L_e(u_{hk}) = L(u_{hk}) - L_i(u_k) \quad \text{Equation (8)}$$

"$L_i(u_K)$" expressed in equation (7) is called "internal information" against the extrinsic information $L_e$ ($u_{hK}$). $L_a(u_K)$ expressed in equation (8) is a priori probability and also corresponds to an extrinsic information value in a process of decoding other element codes. "$L_c$" is a constant determined by a channel and is given by equation (9) in the case of a white Gaussian channel (the mean: 0, distribution $N_0/2$, and signal power $E_b$).

$$L_c = 4E_b/N_0 \quad \text{Equation (9)}$$

The constant "$L_c$" is a value that depends on a noise condition of the channel.

The ordinary method for decoding Turbo codes described above has a problem in that path metric values at all points on the trellis diagram and in all states have to be held at once and therefore large capacity of a memory is required in order to hold the path metric values. To solve this problem, a method is proposed in which capacity of the memory required to hold the path metric values is reduced by performing local decoding using specified time intervals(called "windows") on the trellis diagram. In this case, in an ordinary decoding sequence in which decoding is started from a start point on the trellis diagram, how to handle an initial value of a path metric value in the local backward processing presents a problem. A decoding method is disclosed in an article "Soft-Output Decoding Algorithm for Continuous Decoding of Parallel Concatenated Convolutional Codes" (S. Benedetto et al., Proceeding of IEEE International Conference on Communications, pp. 112-117, 1996) in which backward processing is performed with all trellis states existing ahead of the windows considered to be equally probable and a period during which an initial value of a path metric value is obtained by performing the backward processing is defined as a learning period This decoding method is called a "sliding window method". Moreover, a decoder providing one method that can produce a soft-output in each cycle in the sliding window method is disclosed in an article "VLSI Architectures for Turbo Codes" (IEEE Transactions on VLSI system, pp. 369-379, 1999) in which backward processing modules corresponding in number to a number of time intervals for windows are provided and used in a pipeline arrangement. However, the disclosed decoder has a disadvantage in that it needs a number of backward processing modules corresponding to the number of windows, which increases circuit scale.

FIG. 22 is a schematic block diagram of a conventional decoder of Turbo codes, based on an article "An Intuitive Justification and a Simplified Implementation of the MAP Decoder for Convolutional Codes" (A. J. Viterbi, IEEE Journal on Selected Areas on Communications, pp. 260-264, 1998). The disclosed decoder has a learning module to perform learning processing in the sliding window method in which a decoding schedule is carried out by time-shifting by a number of time intervals corresponding to the size of the window provided, thus enabling production of a soft-output in every cycle. The disclosed decoder is made up of a forward processing module 11, a backward processing module 12, a learning processing module 13, an extrinsic information value calculating module 14, a switch 15, and memories 16, 17, 18, 19.

The forward processing module 11 performs forward processing. The backward processing module 12 performs backward processing. The learning processing module 13 performs learning processing. The extrinsic information value calculating module 14 calculates an extrinsic information value. The switch 15 is ordinarily connected to the backward processing module 12. When a learning result by the learning processing module 13 is fed to the backward processing module 12 as an initial value of a path metric value, the switch 15 is connected to the learning processing module 13. The memory 16 is placed to feed code elements and extrinsic information values to each of the forward processing module 11, backward processing module 12, and learning processing module 13. Also, the memory 17 is placed to feed path metric values calculated by the forward processing module 11 to the extrinsic information value calculating module 14. The memory 18 is placed to feed an extrinsic information value calculated by the extrinsic information value calculating module 14 to the memory 16. That is, the memory 18 is placed to exchange an extrinsic information value to be used as a priori probability information exchanged between the first element code (u, p) decoding and the second element code (u', p') decoding. The memory 19 is placed to temporarily store an interleaving pattern (ILP) therein. Moreover, the memories 16, 19 are structured as a bank of four memories and the memories 17, 18 are structured as a bank of two memories.

Next, operations of the decoder of Turbo codes having configurations shown above are described by referring to FIG. 23. In FIG. 23, "FWP" denotes forward processing, "BWP" denotes backward processing, and "STP" denotes learning processing.

(1) During time 0 to $2L_p$, in order to perform learning processing described later, pre-processing to store element codes and extrinsic information existing from the time point 0 (start point) to $2L_p$ on the trellis diagram as shown in FIG. 23 is performed. Moreover, to decode the second element code (u', p') decoding, processing to temporarily store the interleaving pattern (ILP) in the memory 19, in addition to the above pre-processing, is required.

(2) During time $2L_t$ to $3L_p$, the forward processing module 11 performs forward processing from the time point 0 (start point) to $L_p$ on the trellis diagram as shown in FIG. 23. At the same time, the learning processing module 13 performs learning processing from the time point $2L_P$ to $L_P$ on the trellis diagram as shown in FIG. 23. Moreover, an initial value of a path metric in the learning processing puts all states existing ahead of windows into an equal probability condition.

(3) During time $3L_t$ to $4L_p$, the forward processing module 11 performs forward processing from the time point $L_P$ to $2L_P$ on the trellis diagram as shown in FIG. 23. Also, at the same time, the backward processing module 12 performs backward processing from the time point $L_P$ to 0 (start point) on the trellis diagram as shown in FIG. 23 subsequent to learning processing in (2) in FIG. 23. At the same time, the extrinsic information value calculating module 14 calculates an extrinsic information value. Furthermore, at the same time, the learning processing module 13 performs learning processing from the time point $3L_P$ to $2L_P$ on the trellis diagram as shown in FIG. 23.

(4) During time $4L_t$ to $5L_t$, the forward processing module 11 performs forward processing from the time point $2L_P$ to $3L_P$ on the trellis diagram as shown in FIG. 23. Also, at the same time, the backward processing module 12 performs backward processing from the time point $2L_P$ to $L_P$ on the trellis diagram as shown in FIG. 23 subsequent to learning processing in (3) as shown in FIG. 23. Also, at the same time, the extrinsic information value calculating module 14 calculates an extrinsic information value. Furthermore, the learning processing module 13 performs learning processing from the time point $4L_P$ to $3L_P$ on the trellis diagram as shown in FIG. 23.

(5) During time $5L_t$ to $(N_t-M_t+3L_t)$ $(M_t \leq L_t)$, same processing as the processing (3) and (4) is performed.

(6) During time $(N_t-M_t+3L_t)$ to $(N_t+3L_t)$, the backward processing module 12 performs backward processing from the time point $(N_P-M_P)$ to $N_P$(end point) on the trellis diagram as shown in FIG. 23. At the same time, the extrinsic information value calculating module 14 calculates an extrinsic information value.

(7) Processing (1) to (6) described above is performed as decoding processing to be performed on the first element codes (u, p) decoding and subsequently the decoding processing on the second element codes (u', p') decoding is performed in the same manner as for the above processing (1) to (6) and a series of the processing described above is handled as a first operation of iterative decoding.

(8) After iterative decoding has been completed an appropriate numbers of times (about 10 times), by using sign bits of a Log Likelihood Ratio (LLR) in decoding processing on the second element codes (u', p') decoding, a hard decision on each of the estimated information sequence $u_{hk}$ is produced.

As described above, the conventional decoder of Turbo codes requires the learning processing module 13. Moreover, both the memory 16 to feed element codes and extrinsic information values to each of the forward processing module 11, backward processing module 12, and learning processing module 13 and the memory 19 to temporarily store an interleaving pattern (ILP) have to be as a bank of four memories structured. Also, in the learning processing being pre-processing to start decoding, a time period to temporarily store element codes and extrinsic information values corresponding to $2L_P$ time intervals is required. There is a fear that the disadvantages described above occur not only in decoders to decode Turbo codes but also decoders to generally perform iterative decoding codes using convolutional codes by using the soft-input and soft-output decoding method of the MAP decoding type.

SUMMARY OF THE INVENTION

In view of the above, it is an object of the present invention to provide a method for decoding error correcting codes capable of achieving the decoding a simple configuration and in a short time, a program of the method for decoding error correcting codes, and a device for the method of decoding error correcting codes.

According to a first aspect of the present invention, there is provided a method for performing iterative decoding, the method including:

forward processing to calculate a first path metric value by performing Viterbi decoding in a direction from a start point to an end point on a trellis diagram, based on received data and an extrinsic information value;

backward processing to calculate a second path metric value by performing the Viterbi decoding for every window on the trellis diagram in a direction being reverse to the direction applied to the forward processing based on the received data and the extrinsic information value;

extrinsic information value calculating to calculate the extrinsic information value based on the first and second path metric values; and wherein, in a subsequent iteration of the backward processing, decoding is performed using, as an initial value of a second path metric value for a window boundary, a second path metric value obtained at the window boundary in a preceding iteration.

According to a second aspect of the present invention, there is provided a method for performing iterative decoding to decode error correcting codes, the method including:

forward processing to calculate a first path metric value by performing Viterbi decoding in a direction from a start point to an end point on a trellis diagram, based on received data and an extrinsic information value;

backward processing to calculate a second path metric value by performing the Viterbi decoding for every window on the trellis diagram in a direction being reverse to the direction applied to the forward processing, based on the received data and the extrinsic information value;

extrinsic information value calculating to calculate the extrinsic information value based on the first and second path metric values; and wherein, in a subsequent iteration of said forward processing, decoding is performed by using, as an initial value of a first path metric value for a window boundary, a a first path metric value obtained for the window boundary in a preceding iteration;

wherein, in a subsequent iteration of the backward processing, decoding is performed using, as an initial value of a second path metric value for a window boundary, a second path metric value obtained for the window boundary in a preceding iteration.

In the foregoing first and second aspects, a preferable mode is one wherein the extrinsic information value is multiplied by a normalized coefficient within a range of 0.5 to 0.9.

Also, a preferable mode is one wherein a channel constant to calculate the extrinsic information value is within a range of 1.5 to 2.5.

Also, a preferable mode is one wherein a size of the window is at least four times larger than the code constraint length and one half or less than a maximum length of a codeword.

Also, a preferable mode is one wherein, in the forward processing, the backward processing, and the extrinsic information value calculating, the Viterbi decoding is performed by using a trellis diagram, wherein a positive value and a negative value in a symbol sequence making up a codeword are reversed and in which a path having a minimum path metric value is selected.

According to a third aspect of the present invention, there is provided a decoding program to have a computer implement a method for performing iterative decoding to decode error correcting codes, the method including:

forward processing to calculate a first path metric value by performing Viterbi decoding in a direction from a start point to an end point on a trellis diagram, based on received data and an extrinsic information value;

backward processing to calculate a second path metric value by performing the Viterbi decoding for every window on the trellis diagram in a direction being reverse to the direction applied to the forward processing based on the received data and the extrinsic information value;

extrinsic information value calculating to calculate the extrinsic information value based on the first and second path metric values; and wherein, in a subsequent iteration of the backward processing, decoding is performed using, as an initial value of a second path metric value for a window boundary, a second path metric value obtained for the window boundary in a preceding iteration.

According to a fourth aspect of the present invention, there is provided a decoding program to have a computer implement a method for performing iterative decoding to decode error correcting codes, the method including:

forward processing to calculate a first path metric value by performing Viterbi decoding in a direction from a start point to an end point on a trellis diagram, based on received data and an extrinsic information value;

backward processing to calculate a second path metric value by performing the Viterbi decoding for every window on the trellis diagram in a direction being reverse to the direction applied to the forward processing, based on the received data and the extrinsic information value;

extrinsic information value calculating to calculate the extrinsic information value based on the first and second path metric values; and wherein, in a subsequent iteration of said forward processing, decoding is performed by using, as an initial value of a first path metric value for a window boundary, a first path metric value obtained for the window boundary in a preceding iteration;

wherein, in a subsequent iteration of the backward processing, decoding is performed using, as an initial value of a second path metric value for a window boundary, a second path metric value obtained for the window boundary in a preceding iteration.

According to a fifth aspect of the present invention, there is provided a decoder of error correcting codes including:

a forward processing module to perform forward processing to calculate a first path metric value by performing Viterbi decoding in a direction from a start point to an end point on a trellis diagram based on received data and an extrinsic information value;

a backward processing module to perform backward processing to calculate a second path metric value by performing the Viterbi decoding for every window on the trellis diagram in a direction being reverse to the direction applied to the forward processing based on the received data and the extrinsic information value;

an extrinsic information value calculating module to perform extrinsic information value calculating to calculate the extrinsic information value based on the first and second path metric values;

wherein decoding consisting of the forward processing, the backward processing, and the extrinsic information value calculating is performed; and wherein the backward processing module has a memory in which the second path metric value calculated in a preceding iteration is temporarily held and the backward processing module performs iterative decoding by reading the second path metric value from the memory to use it as an initial value of the second path metric value for the window boundary in a subsequent iteration.

According to a sixth aspect of the present invention, there is provided a decoder of error correcting codes including:

A forward processing and backward processing shared-use module to alternately perform forward processing to calculate a first path metric value by performing Viterbi decoding in a direction from a start point to an end point on a trellis diagram, based on received data and an extrinsic information value, and backward processing to calculate a second path metric value by performing the Viterbi decoding for every window on the trellis diagram in a direction being reverse to the direction applied to the forward processing, based on the received data and the extrinsic information value;

an extrinsic information value calculating module to perform extrinsic information value calculating to calculate the extrinsic information value based on the first and second path metric values;

wherein the forward processing module has a first memory in which the first path metric value in a window boundary obtained at time when the forward processing for windows has been completed last time is temporarily held and the backward processing module has a second memory in which the second path metric value in the window calculated at time of performing iterative decoding last time is held temporarily; and wherein the forward processing and backward processing shared-use module performs iterative decoding by reading the first path metric in the window boundary from the first memory and by using it as an initial value of the first path metric in the window boundary to be obtained at time of performing iterative decoding this time and by reading the second path metric value in the window boundary from the second memory and by using it as an initial value of the second path metric in the window boundary to be obtained at time of performing iterative decoding this time.

In the foregoing fifth and sixth aspect, a preferable mode is one wherein the extrinsic information value obtained by being multiplied by a normalized coefficient within a range of 0.5 to 0.9 is used.

Also, a preferable mode is one wherein a channel constant to calculate the extrinsic information value is within a range of 1.5 to 2.5.

Also, a preferable mode is one wherein a size of the window is at least four times larger than the code constraint length and one half or less than a maximum length of a codeword.

Furthermore, a preferable mode is one wherein the forward processing module, the backward processing module, and the extrinsic information value calculating module perform the Viterbi decoding by using the trellis diagram, wherein a positive value and a negative value in a symbol sequence making up a codeword are reversed and in which a path having a minimum path metric value is selected.

With the above configurations, the method of decoding error correcting codes to perform iterative decoding which includes the forward processing, backward processing, and extrinsic information value calculating. In the backward processing, a second path metric value in the window boundary obtained at the time of performing a preceding iterative decoding is used as an initial second path metric value in the window boundary to be obtained at the time of performing a current iterative decoding. Decoding of error correcting codes can be achieved in a simple configuration and in a short time.

With another configuration as above, since the computer runs the decoding program of error correcting codes, it is possible to reduce an amount of arithmetic operations of the computer, capacity of the storage device, currents consumed by the computer and to shorten the processing time.

With another configuration as above, since, in the forward processing, backward processing, and extrinsic information value calculating, the Viterbi decoding is performed using the trellis diagram in which a negative value and a positive value in a symbol sequence making up a codeword are reversed and since a path having a minimum metric value is selected, memory capacity of the storage device making up the decoder and/or circuit scales can be reduced.

BRIEF DESCRIPTION OF THE DRAWINGS

The above and other objects, advantages, and features of the present invention will be more apparent from the following description taken in conjunction with the accompanying drawings in which.

DETAILED DESCRIPTION OF THE PREFERRED EMBODIMENTS

Best modes of carrying out the present invention will be described in further detail using various embodiments with reference to the accompanying drawings.

First Embodiment

Figure 1:
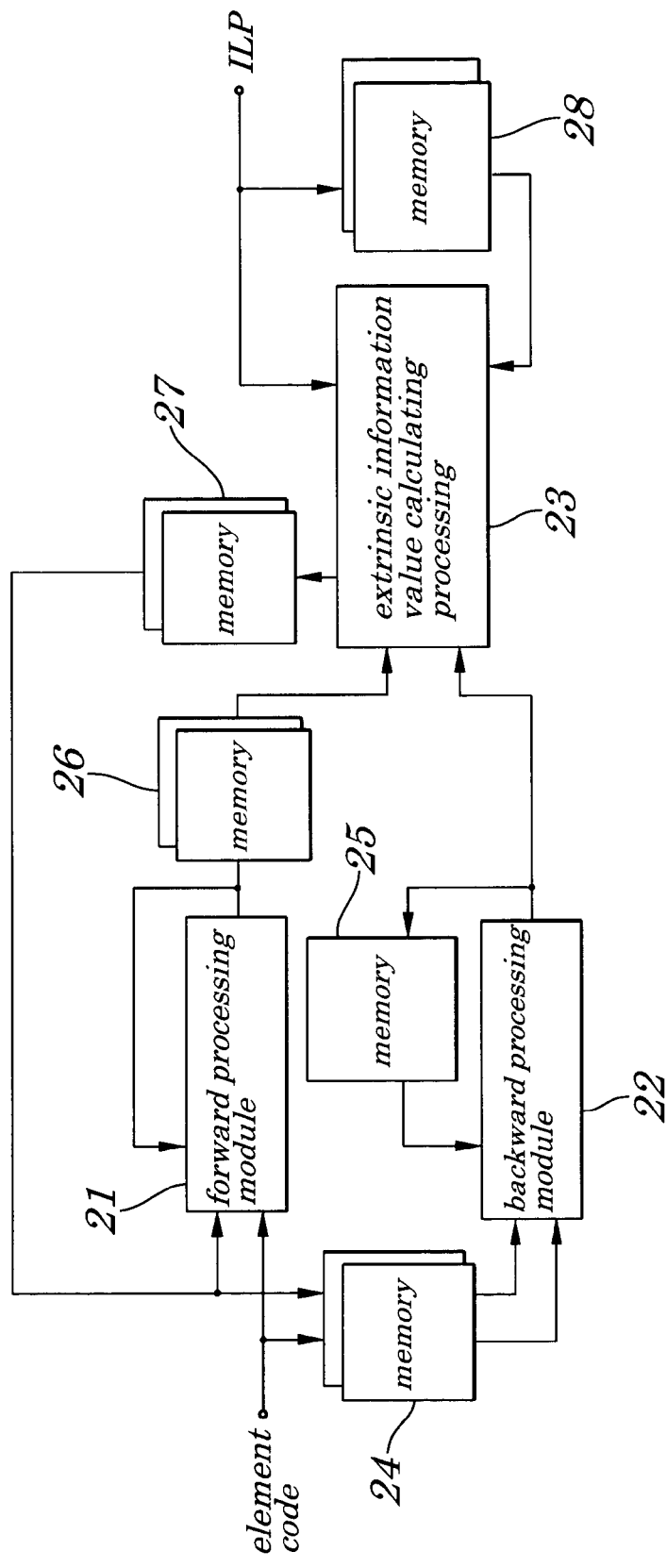
FIG. 1 is a schematic block diagram of a decoder of Turbo codes according to a first embodiment of the present invention.

FIG. 1 is a schematic block diagram of a decoder of Turbo codes according to the first embodiment of the present invention. The decoder of Turbo codes of the first embodiment includes a forward processing module 21, a backward processing module 22, an extrinsic information value calculating module 23, and memories 24, 25, 26, 27, 28.

The forward processing module 21 performs forward processing. The backward processing module 22 performs backward processing. The extrinsic information value calculating module 23 calculates an extrinsic information value. The memory 24 is placed to feed element codes and extrinsic information values to the backward processing module 22. The memory 25 is placed to temporarily store path metrics in a window boundary calculated by the backward processing module 22. The memory 26 is placed to feed path metrics calculated by the forward processing module 21 to the extrinsic information value calculating module 23. The memory 27 is placed to feed an extrinsic information value calculated by the extrinsic information value calculating module 23 to the forward processing module 21 and memory 24. That is, the memory 27 is placed to exchange an extrinsic information value to be used as a priori probability between the first element code (u, p) decoding and the second element code (u', p') decoding. The memory 28 is placed to temporarily store an interleaving pattern ILP. Each of the memories 24, 26, 27, 28 is structured as a bank of two memories.

Figure 2:
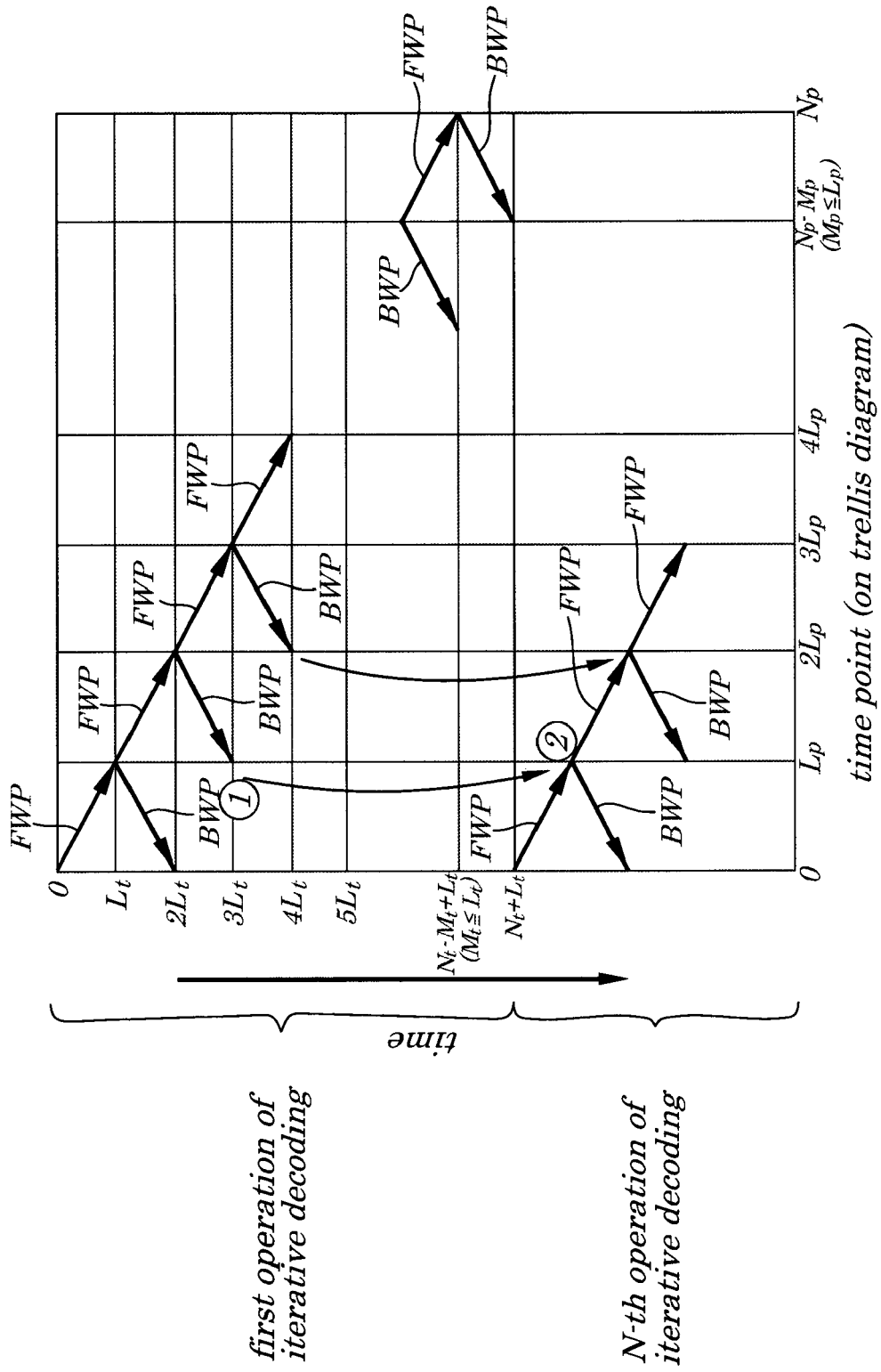
FIG. 2 is a trellis diagram of the operations of the decoder of the first embodiment of the present invention.

Operations of the decoder of Turbo codes are described by referring to FIG. 2. FIG. 2 is a trellis diagram of the operations of the decoder of the first embodiment of the present invention. In FIG. 2, "FWP" denotes forward processing and "BWP" denotes backward processing.

(1) During time 0 to $L_t$, the forward processing module 21 performs processing from the time point 0 (start point) to $L_P$ on the trellis diagram as shown in FIG. 2.

(2) During time $L_t$ to $2L_t$, the forward processing module 21 performs forward processing from the time point $L_P$ to $2L_P$ on the trellis diagram as shown in FIG. 2 subsequent to forward processing as shown in (1) above. Also, at the same time, the backward processing module 22 performs backward processing from the time point $L_P$ to 0 (start point) on the trellis diagram as shown in FIG. 2. Moreover, at the same time, the extrinsic information value calculating module 23 calculates an extrinsic information value. At this point, an initial value of a β path metric value in a window boundary (at the time point $L_p$) in the backward processing puts all states existing ahead of windows into an equal probability condition.

(3) During time $2L_t$ to $3L_t$, the forward processing module 21 performs forward processing from the time point $2L_p$ to $3L_p$ on the trellis diagram as shown in FIG. 2 subsequent to forward processing as shown in (2) above. Also, at the same time, the backward processing module 22 performs backward processing from the time point $2L_p$ to $L_p$ on the trellis diagram as shown in FIG. 2. moreover, the extrinsic information value calculating module 23 calculates an extrinsic information value. At this point, an initial value of the β path metric value in a window boundary (at the time point $2L_p$) in the backward processing puts all states existing ahead of windows into a equal probability condition, as in the case of (2) above. Furthermore, the β path metric value in the window boundary (at the time point $L_p$) on the trellis diagram as shown in FIG. 2 is temporarily stored in the memory 25 to be used as an initial value of the β path metric value in the backward processing at time of performing iterative decoding last time (see ⓪ in FIG. 2).

(4) During time $3L_t$ to $(N_t-M_t+L_t)$ $(M_t \leqq L_t)$, each of the forward processing module 21, backward processing module 22, and extrinsic information value calculating module 23 iterates the processing (3) described above until the forward processing reaches a time point $N_P$ (end point) on the trellis diagram as shown in FIG. 2.

(5) During time $(N_t-M_t+L_t)$ to $(N_t+L_t)$, the backward processing module 22 performs backward processing from the time point $N_P$ (end point) to $(N_P-M_P)$ $(M_P \leqq L_p)$ on the trellis diagram. Also, the extrinsic information value calculating module 23 calculates an external value. Furthermore, the β path metric value in the window boundary (at time point $N_P-M_P$) on the trellis diagram as shown in FIG. 2 is temporarily stored in the memory 25 to be used as an initial value of the β path metric value in the backward processing at time of performing iterative decoding next time.

(6) Processing (1) to (5) described above is performed as decoding processing to be performed on the first element codes (u, p) decoding and, subsequently, the decoding processing on the second element codes (u', p') decoding is performed in the same manner as the above processing (1) to (5) and a series of the decoding processing is handled as a first operation of the iterative decoding. Thereafter, the backward processing module 22 performs iterative decoding processing by using the β path metric value in the window boundary having been temporarily stored in the memory 25, as an initial value of the β path metric value in the backward processing, at time of performing iterative decoding next time. (see ② in FIG. 2).

(7) After iterative decoding has been completed an appropriate numbers of times (about 10 times), by using sign bits of a Log Likelihood Ratio (LLR) in decoding processing on the second element codes (u', p') decoding, a hard decision on each of the estimated information sequence $u_{hk}$ is produced.

Figure 3:
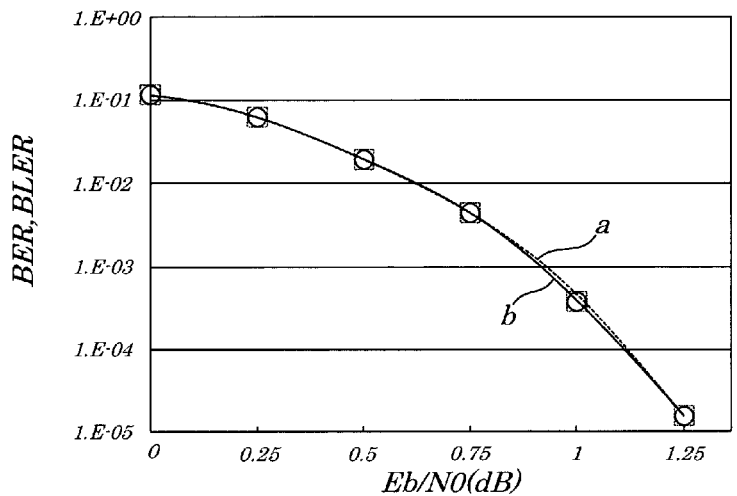
FIG. 3 is a diagram comparing a decoding characteristic (curb "a") of the first embodiment of the present invention and a decoding characteristic (curb "b") obtained by a conventional sliding window method.

FIG. 3 is a diagram comparing a decoding characteristic (curve "a") of the first embodiment and a decoding characteristic (curve "b") obtained by a conventional sliding window method. Bit error rates (BER) and block error rates (BLER) are respectively plotted as ordinate. Moreover, values plotted as a horizontal axis are those obtained by dividing a signal-to-noise ratio of signals existing immediately before the decoder by a number of information bits per symbol in a channel More exactly, they are ratios Eb/N0 between signal energy Eb in every one bit and one-side power spectrum density N0. Here, the number of data is 656, the number of times of iterative decoding is eight, and a size of a window is 64 time intervals. As is apparent from FIG. 3, no significant difference exists between the decoding characteristic (curve "b") of the decoder using the sliding window method and the decoding characteristic (curve "a") of the decoder of the embodiment.

Figure 4:
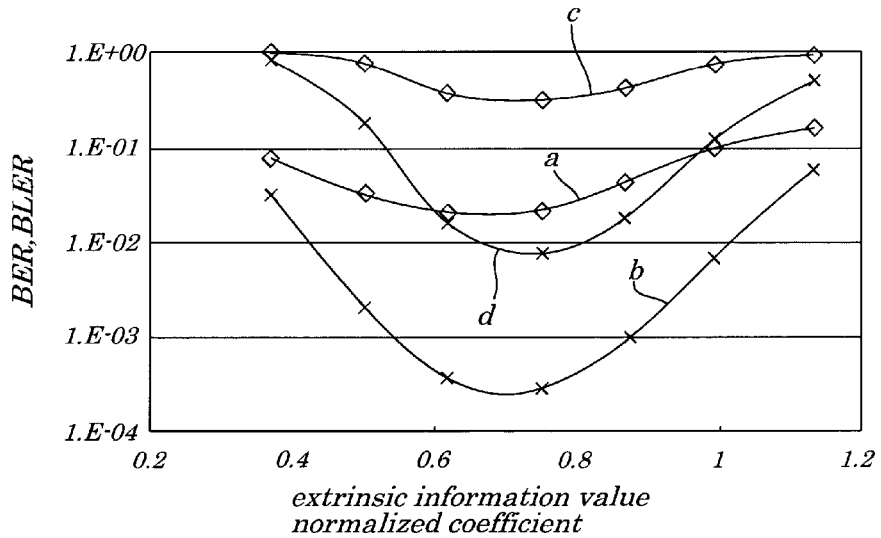
FIG. 4 is a diagram illustrates simulation results of a characteristic of a bit error rate and a block error rate to an extrinsic information value normalized coefficient employed in the first embodiment of the present invention.
Figure 5:
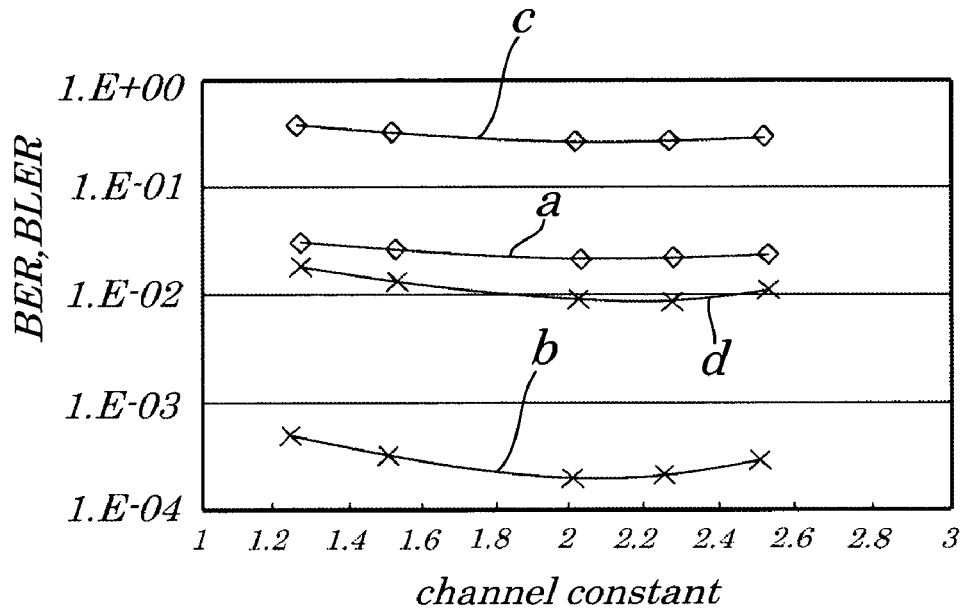
FIG. 5 is a diagram illustrates simulation results of a characteristic of a bit error rate and a block error rate to a channel constant employed in the first embodiment of the present invention.
Figure 6:
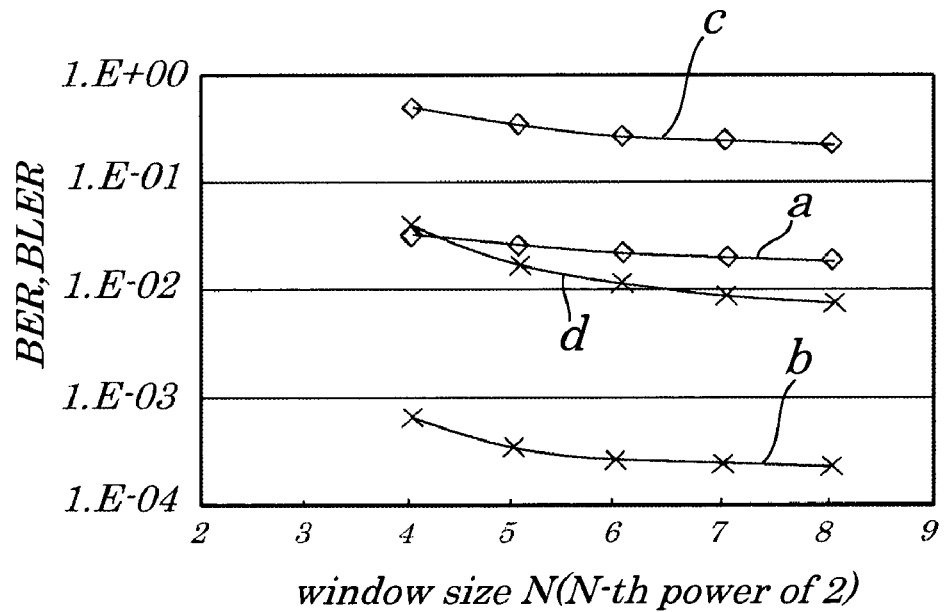
FIG. 6 is a diagram illustrates simulation results of a characteristic of a bit error rate and a block error rate to a window size employed in the first embodiment of the present invention.

Moreover, FIG. 4 to FIG. 6 show results of simulation performed by using, as a parameter, each of a normalized coefficient (extrinsic information value normalized coefficient) by which an extrinsic information value is multiplied, a channel constant by which a systematic bit is multiplied when the extrinsic information value is calculated, and a window size. The simulation is performed in the case of Eb/N0 being 0.4 dB and in the case of Eb/N0 being 0.8 dB under a condition of "RMC64" designated in 3GPP (3rd Generation Partnership Project) being a partnership project planned to establish 3rd generation technological standards and by setting the number of iterative decoding to be eight. FIG. 4 illustrates simulation results of a characteristic of a bit error rate (BER) and a block error rate (BLER) to an extrinsic information value normalized coefficient. In FIG. 4, the curve "a" shows a characteristic of a bit error rate (BER) to an extrinsic information value normalized coefficient to be obtained when the Eb/N0 is 0.4 dB. The curve "b" shows a characteristic of a bit error rate (BER) to an extrinsic information value normalized coefficient to be obtained when the Eb/N0 is 0.8 dB. The curve "c" shows a characteristic of a block error rate (BLER) to an extrinsic information value normalized coefficient to be obtained when the Eb/N0 is 0.4 dB. The curve "d" shows a characteristic of a block error rate (BLER) to an extrinsic information value normalized coefficient to be obtained when the Eb/N0 is 0.8 dB. There is a tendency that a larger soft-output value is output in the Max-Log-MAP algorithm when compared with the case of the MAP algorithm. Therefore, by multiplying an extrinsic information value by a normalized coefficient, it is made possible to cause the decoding characteristic to come near to the decoding characteristic that can be achieved using the MAP algorithm. As is understood from FIG. 4, a best decoding characteristic can be obtained when the extrinsic information value normalized coefficient is within a range of 0.5 to 0.9, about 0.7 in particular.

FIG. 5 illustrates simulation results of a characteristic of a bit error rate (BER) and a block error rate (BLER) to a channel constant. In FIG. 5, the curve "a" shows a characteristic of a bit error rate (BER) to a channel constant to be obtained when the Eb/N0 is 0.4 dB. The curve "b" shows a characteristic of a bit error rate (BER) to a channel constant to be obtained when the Eb/N0 is 0.8 dB. The curve "c" shows a characteristic of a block error rate (BLER) to a channel constant to be obtained when the Eb/N0 is 0.4 dB. The curve "d" shows a characteristic of a block error rate (BLER) to a channel constant to be obtained when the Eb/N0 is 0.8 dB. Though the channel constant is determined by a value of a communication condition (Eb/N0), in this embodiment, it is set to be a constant. As is apparent from FIG. 5, a best decoding characteristic can be obtained when the channel constant is within a range of 1.5 to 2.5, about 2 in particular.

FIG. 6 illustrates simulation results of a characteristic of a bit error rate (BER) and a block error rate (BLER) to a window size. In FIG. 6, the curve "a" shows a characteristic of a bit error rate (BER) to a window size to be obtained when the Eb/N0 is 0.4 dB. The curve "b" shows a characteristic of a bit error rate (BER) to a window size to be obtained when the Eb/N0 is 0.8 dB. The curve "c" shows a characteristic of a block error rate (BLER) to a window size to be obtained when the Eb/N0 is 0.4 dB. The curve "d" shows a characteristic of a block error rate (BLER) to a window size to be obtained when the Eb/N0 is 0.8 dB. As is apparent from FIG. 6, though a decoding characteristic is improved by making a window size larger, a converging tendency occurs. That is, when a window size is at least four times larger than the code constraint length and when the window size has a value being one half or less than a maximum length of codeword, a good decoding characteristic can be obtained without causing an increased scale of circuits.

Figure 22:
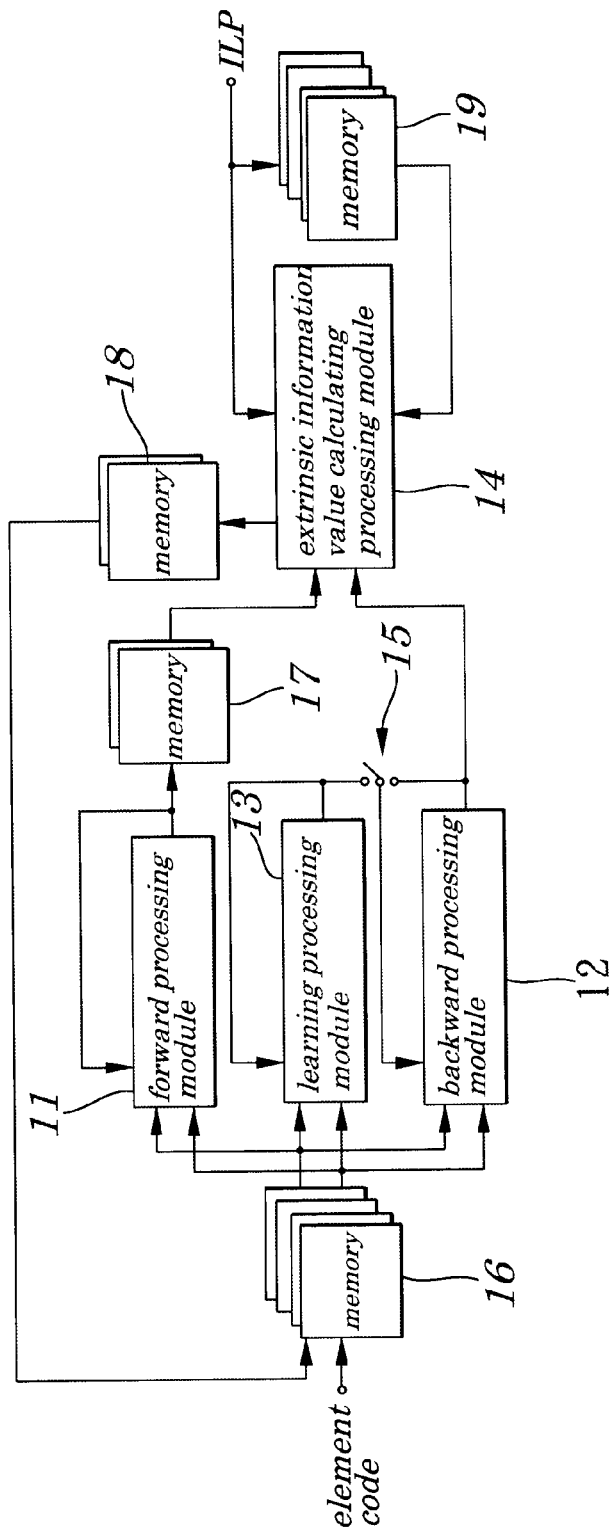
FIG. 22 is a schematic block diagram of configurations of the conventional decoder of Turbo codes, which is used to explain the prior art.
Figure 23:
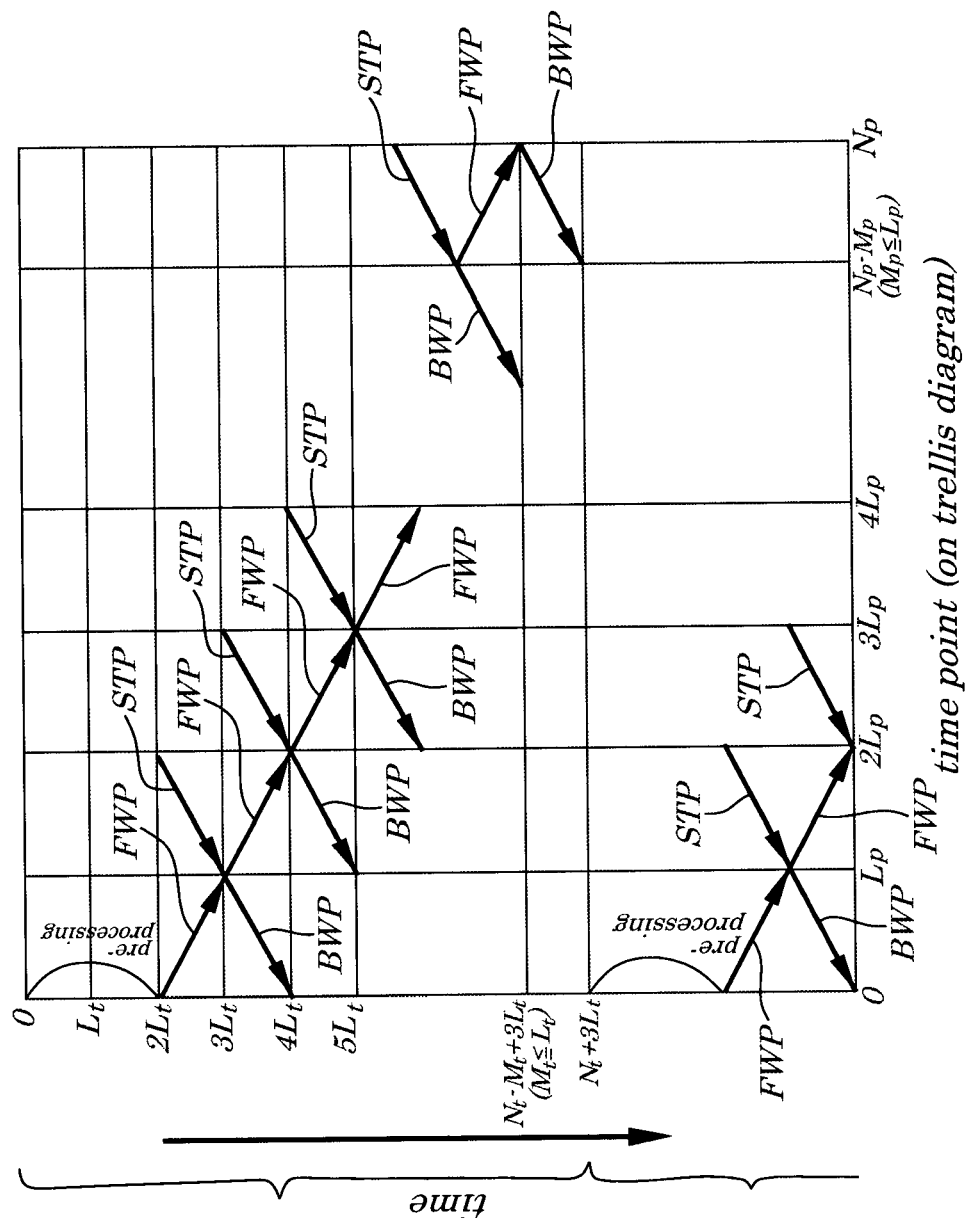
FIG. 23 is a trellis diagram of operations of the conventional decoder of Turbo codes, which is used to explain the prior art.

Thus, according to the configurations of the embodiment, by placing the memory 25 used to temporarily store a β path metric value in a window boundary in the backward processing at time of performing iterative decoding last time, the β path metric value is used as an initial value of the β path metric value in the backward processing at time of performing iterative decoding next time. Therefore, learning processing to calculate an initial value of a path metric value that was required in the conventional decoder of Turbo codes as shown in FIG. 22 becomes unnecessary. This causes the learning processing module 13 as shown in FIG. 22 to become unnecessary in the embodiment. By placing only the bank of two memories 24, 28, instead of the bank of four memories 16, 19 (see FIG. 22), soft-output production in every cycle can be achieved. Moreover, pre-processing period required in the conventional encoder of Turbo codes becomes unnecessary. Also, since the forward processing module 21 and the backward processing module 22 are independently placed and the backward processing is started later, by the time corresponding to window time intervals, than the forward processing, calculation of extrinsic information values for every cycle is made possible.

Here, its particular example is shown. The 3GPP designates that the maximum number of information bits is 5, 114 bits. Therefore, when a bit width of received data is 8 bits and a window size is 128, capacity of the memory 25 making up the decoder of the embodiment requires 8, 320 (40 words×13 bits×8 states×2) bits to temporarily store an initial value (13 bits) of the β path metric value. However, the memory having a memory capacity of 7, 680 {128 words×(16 bits+14 bits)× 2} bits to temporarily store element codes (16 bits) and extrinsic information values (14 bits) and the memory having a memory capacity of 3, 328 (128 words×13 bits×2) bits to temporarily store an interleaving pattern (13 bits), both having been conventionally required, become unnecessary in the embodiment. Therefore, according to the configurations of the embodiment, the memory capacity of 2, 688 {(7, 680+3, 328)−8, 320} bits in total can be reduced. On the other hand, its logical circuits can be also reduced, that is, one piece of the learning processing module 13 as shown in FIG. 22, being equivalent about 5k gates in circuit scale, can be reduced. Moreover, processing time can be also shortened, that is, when a window size is L and a soft-output is produced in every cycle and, if a first element code (u, p) decoding and a second element code (u', p') decoding are decoded, time 2L·CK (CK being time of one cycle of a basic clock) for each of the first and second element codes can be shortened. For example, in the case of a window size being 128, under conditions of "RMC64" designated in the 3GPP, an equation of {(128×2)/(1, 296+(128×3=0.1523 . . . )} for one operation of decoding each of the first and second element codes is provided, which shows that processing time can be shortened by about 15.2%. As a result, by applying the decoder of the embodiment to portable electronic devices such as portable cellular phones, circuit scales can be reduced and processing time can be shortened, which enables a life of a battery or a like to be lengthened and such portable electronic devices to be configured at low costs.

Second Embodiment

Figure 7:
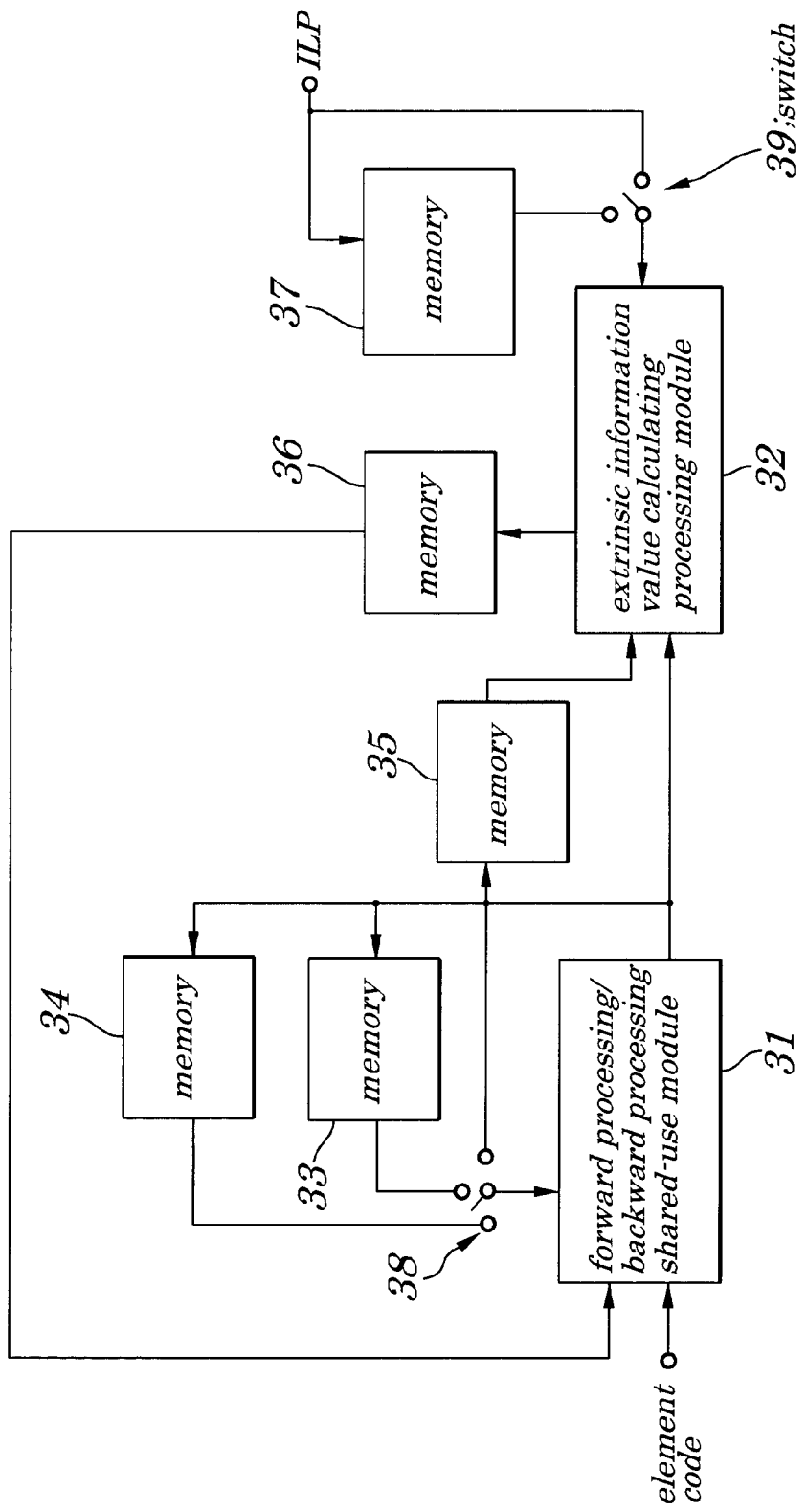
FIG. 7 is a schematic block diagram of a decoder of Turbo codes according to a second embodiment of the present invention.

FIG. 7 is a schematic block diagram of a decoder of Turbo codes according to a second embodiment of the present invention. The decoder of Turbo codes of the second embodiment is made up of a forward processing and backward processing shared-use module 31, an extrinsic information value calculating module 32, memories 33, 34, 35, 36, 37, and switches 38, 39. The forward processing and backward processing shared-use module 31 performs forward processing and backward processing alternately. The extrinsic information value calculating module 32 calculates an extrinsic information value.

The memory 33 is placed to temporarily store an α path metric value in a window boundary calculated in the forward processing by the forward processing and backward processing shared-use module 31. The memory 34 is placed to temporarily store a β path metric value in a window boundary calculated in the backward processing by the forward processing and backward processing shared-use module 31. The memory 35 is placed to feed a path metric value calculated in the forward processing by the forward processing and backward processing shared-use module 31. The memory 36 is placed to feed an extrinsic information value calculated by the extrinsic information value calculating module 32 to the forward processing and backward processing shared-use module 31. That is, the memory 36 is placed to exchange an extrinsic information value to be used as a priori probability between the first element code (u, p) decoding and the second element code (u', p') decoding. The memory 37 is placed to temporarily store an interleaving pattern ILP. Moreover, the memory 37 is structured as a single bank to perform the forward processing, backward processing, and extrinsic information value calculating alternately in a time-division manner.

The switch 38 ordinarily connects the memory 35 to the forward processing and backward processing shared-use module 31, however, when the forward processing and backward processing shared-use module 31 starts processing on a second window and thereafter in the forward processing, connects the memory 33 to the forward processing and backward processing shared-use module 31 in order to feed an initial value of a path metric value in a window boundary in the forward processing to the forward processing and backward processing shared-use module 31. Moreover, the switch 38, when the forward processing and backward processing shared-use module 31 starts a second-time backward processing and thereafter for iterative decoding, connects the memory 34 to the forward processing and backward processing shared-use module 31 in order to feed an initial value of the path metric value in a window boundary in the backward processing to the forward processing and backward processing shared-use module 31. The switch 39, when the extrinsic information value calculating module 32 uses an interleaving pattern ILP, connects the memory 37 to the extrinsic information value calculating module 32 and connects, when the extrinsic information value calculating module 32 feeds the interleaving pattern ILP to an outside, the memory 37 to an output terminal.

Figure 8:
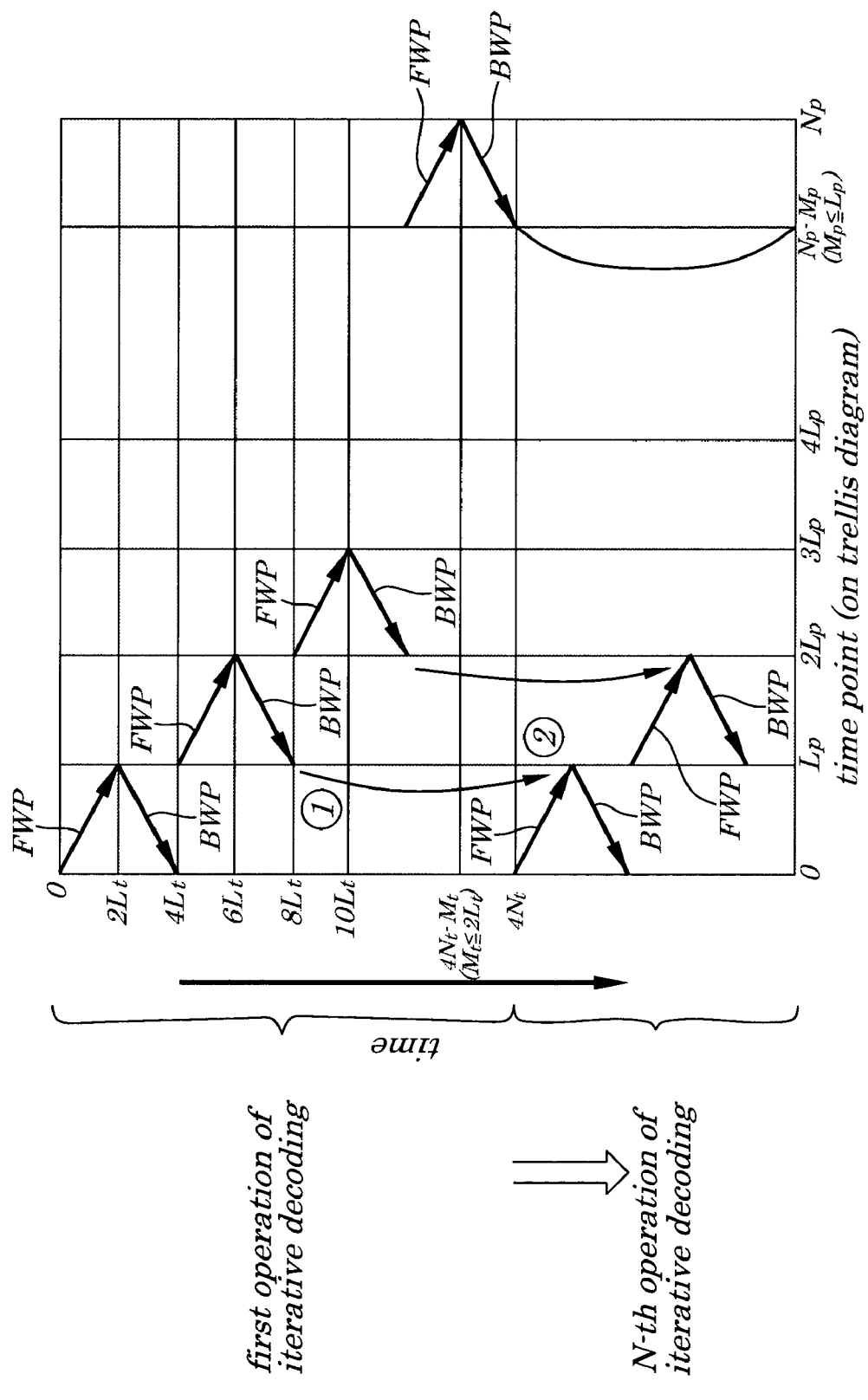
FIG. 8 is a trellis diagram of the operations of the decoder of Turbo codes of the second embodiment of the present invention.

Next, operations of the decoder of Turbo codes having configurations described above are described by referring to FIG. 8. FIG. 8 is a trellis diagram of the operations of the decoder of Turbo codes of the second embodiment of the present invention. In FIG. 8, "FWP" denotes forward processing and "BWP" denotes backward processing.

(1) During time 0 to $2L_t$, the forward processing and backward processing shared-use module 31 performs forward processing from the time point 0 (start point) to $L_P$ on the trellis diagram as shown in FIG. 8. Then, the forward processing and backward processing shared-use module 31 temporarily stores an α path metric value at time of completion of the forward processing as an initial value of the α path metric value into the memory 33.

(2) During time $2L_t$ to $4L_t$, the forward processing and backward processing shared-use module 31 performs backward processing from the time point $L_P$ to 0 (start point) on the trellis diagram as shown in FIG. 8. Also, at the same time, the extrinsic information value calculating module 32 calculates an extrinsic information value. At this point, an initial value of a β path metric value in the window boundary (time point $L_P$) in the backward processing puts all states existing ahead of windows into an equal probability condition.

(3) During time $4L_t$ to $6L_t$, the forward processing and backward processing shared-use module 31, by using an α path metric value as an initial value of the α path metric value in the window boundary being temporarily stored in the memory 33 in the above processing (1), performs forward processing from the time point $L_P$ to $2L_P$ on the trellis diagram as shown in FIG. 8.

(4) During time $6L_t$ to $8L_t$, the forward processing and backward processing shared-use module 31 performs backward processing from the time point $2L_P$ to $L_P$ on the trellis diagram as shown in FIG. 8. Also, at the same time, the extrinsic information value calculating module 32 calculates an extrinsic information value. Then, the forward processing and backward processing shared-use module 31 temporarily stores a β path metric value at time of completion of the backward processing as an initial value of the β path metric value in the window boundary into the memory 34 (see FIG. 8 ①).

(5) During time $8L_t$ to $(4N_t-M_t)$ ($M_t$ (1) $2L_t$), the forward processing and backward processing shared-use module 31 alternately performs processing (3) and (4) described above until steps of the forward processing reach the time point $2L_P$ to $N_P$ (end point) on the trellis diagram as shown in FIG. 8.

(6) During time $(4N_t-M_t)$ to $4N_t$, the forward processing and backward processing shared-use module 31 performs backward processing from the time point $N_P$ (end point) to $(N_P-M_P)$ on the trellis diagram as shown in FIG. 8. Also, at the same time, the extrinsic information value calculating module 32 calculates an extrinsic information value.

(7) Processing (1) to (6) described above is performed as decoding processing to be performed on the first element codes (u, p) decoding and subsequently the decoding processing on the second element codes (u', p') decoding is performed in the same manner as for the above processing (1) to (6) and a series of the processing described above is handled as a first operation of iterative decoding. Thereafter, the forward processing and backward processing shared-use module 31 performs iterative decoding processing (see FIG. 8 ②) by using a β path metric value in the window boundary being temporarily stored into the memory 34 at time of performing iterative decoding last time as an initial value of the β path metric value in the window boundary in the backward processing.

(8) After iterative decoding has been completed an appropriate numbers of times (about 10 times), by using sign bits of a Log Likelihood Ratio (LLR) in decoding processing on the second element codes (u', p') decoding, a hard decision on each of the estimated information sequence $u_{hk}$ is produced.

Thus, according to configurations of the second embodiment, the forward processing and backward processing shared-use module 31 in which the forward processing and the backward processing are performed alternately is placed. Moreover, the forward processing and backward processing shared-use module 31 performs an Add-Compare-Select (ACS) arithmetic operation in two clocks. Moreover, the memory 33 to temporarily store an α path metric value in a window boundary obtained at time when forward processing for a window has completed last time is placed and this α path metric value is used as an initial value of α path metric value in a window boundary at time of performing forward processing next time. Also, the memory 34 to temporarily store a β path metric value in the window boundary obtained in the backward processing at time of performing iterative decoding last time is placed and the β path metric value is used as an initial value of the β path metric value in the backward processing at time of performing iterative decoding next time. Therefore, the learning processing to calculate an initial value of a path metric that was required in the conventional decoder of Turbo codes as shown in FIG. 22 is made unnecessary. This also makes unnecessary the learning processing module 13 as shown in FIG. 22. Also, instead of the structured bank of four memories 16, 19 (see FIG. 22), by only placing single bank memories 33, 37, production of a soft-output in every two cycles can be achieved. Furthermore, the pre-processing period that was required in the conventional decoder of Turbo codes is made unnecessary.

Third Embodiment

In the above first and second embodiments, no reference is made to a method for calculating a branch metric value and it is presumed that a conventional calculation method is used. In a Max-Log-MAP algorithm, a branch metric is calculated based on a correlation value (Euclidean distance) between a symbol sequence making up a codeword and a symbol sequence of a received word and on an extrinsic information value. The branch metric value represents a likelihood of a received word to a codeword. The larger the branch metric value is, the greater the likelihood is. Conventionally, in an operation and a delta calculation required after the calculation of the branch metric value, decoding processing is performed by selecting a maximum value out of a plurality of operation results or calculation results. Here, a path having a maximum path metric value becomes a maximum likelihood path. However, in the conventional calculation method, the path metric having large values is selected and summation of the path metric value is performed and, as a result, the path metric value becomes very large, thus causing an increase in the memory capacity and/or an increase in the circuit scale of each of the modules making up the decoder.

Thus, according to the embodiment of the present invention, in the processing to be performed by a forward processing module 21, backward processing module 22, and extrinsic information value calculating module 23 (configurations in the first embodiment) as shown in FIG. 1 and in the processing to be performed by a forward processing and backward processing shared-use module 31 and an extrinsic information value calculating module 32 (configurations in the second embodiment), by performing the Viterbi decoding using a trellis diagram in which "0" and "1" in a symbol sequence making up a codeword are reversed, that is, by selecting a minimum value out of a plurality of operation results or calculation results and by selecting a path having a minimum value in each of the forward processing, backward processing and extrinsic information value calculating, a width of operation bits can be narrowed and memory capacity and/or circuit scale of each module making up the decoder can be reduced accordingly.

Figure 9:
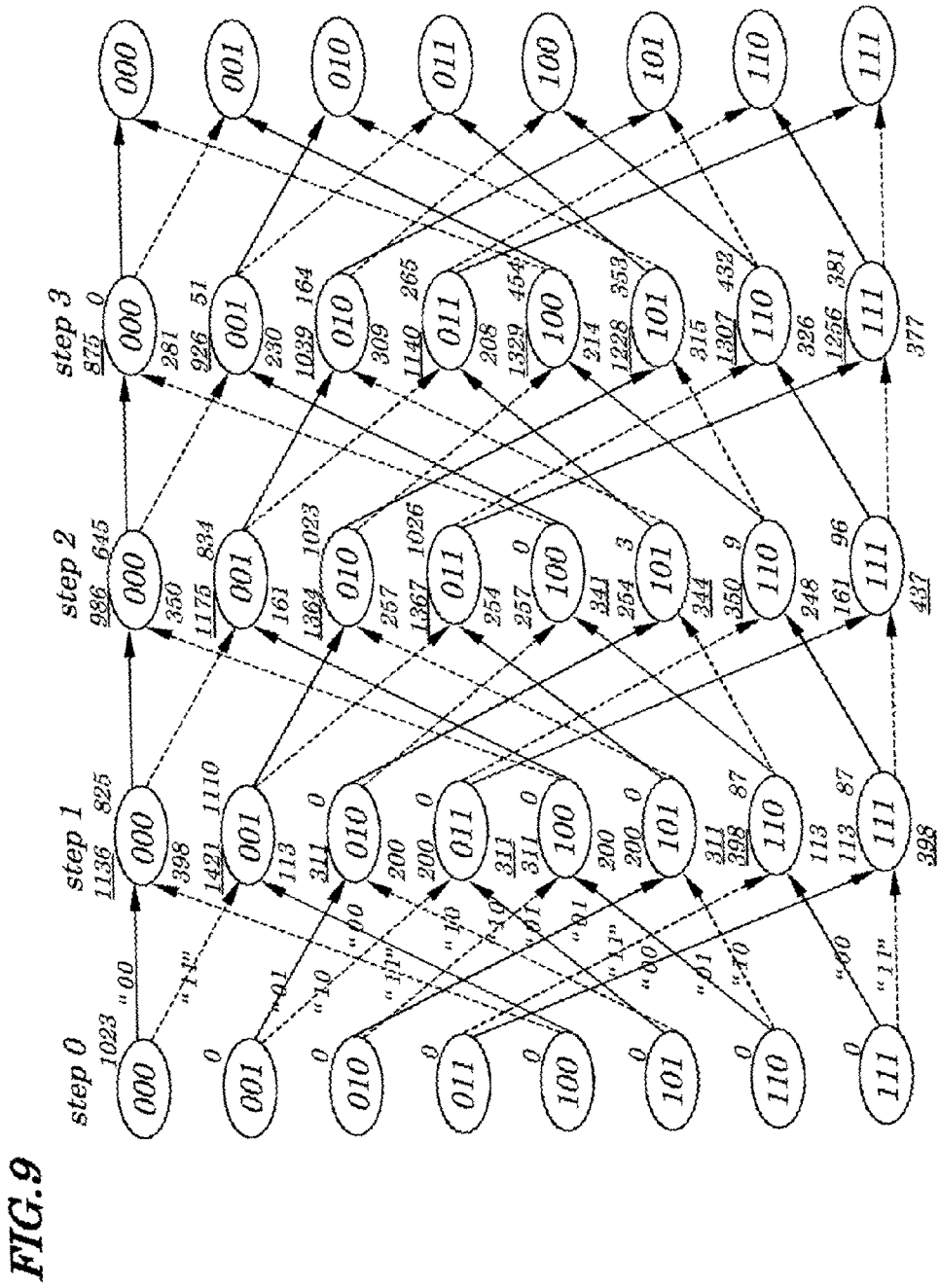
FIG. 9 is a trellis diagram of using a maximum value selecting method.
Figure 10:
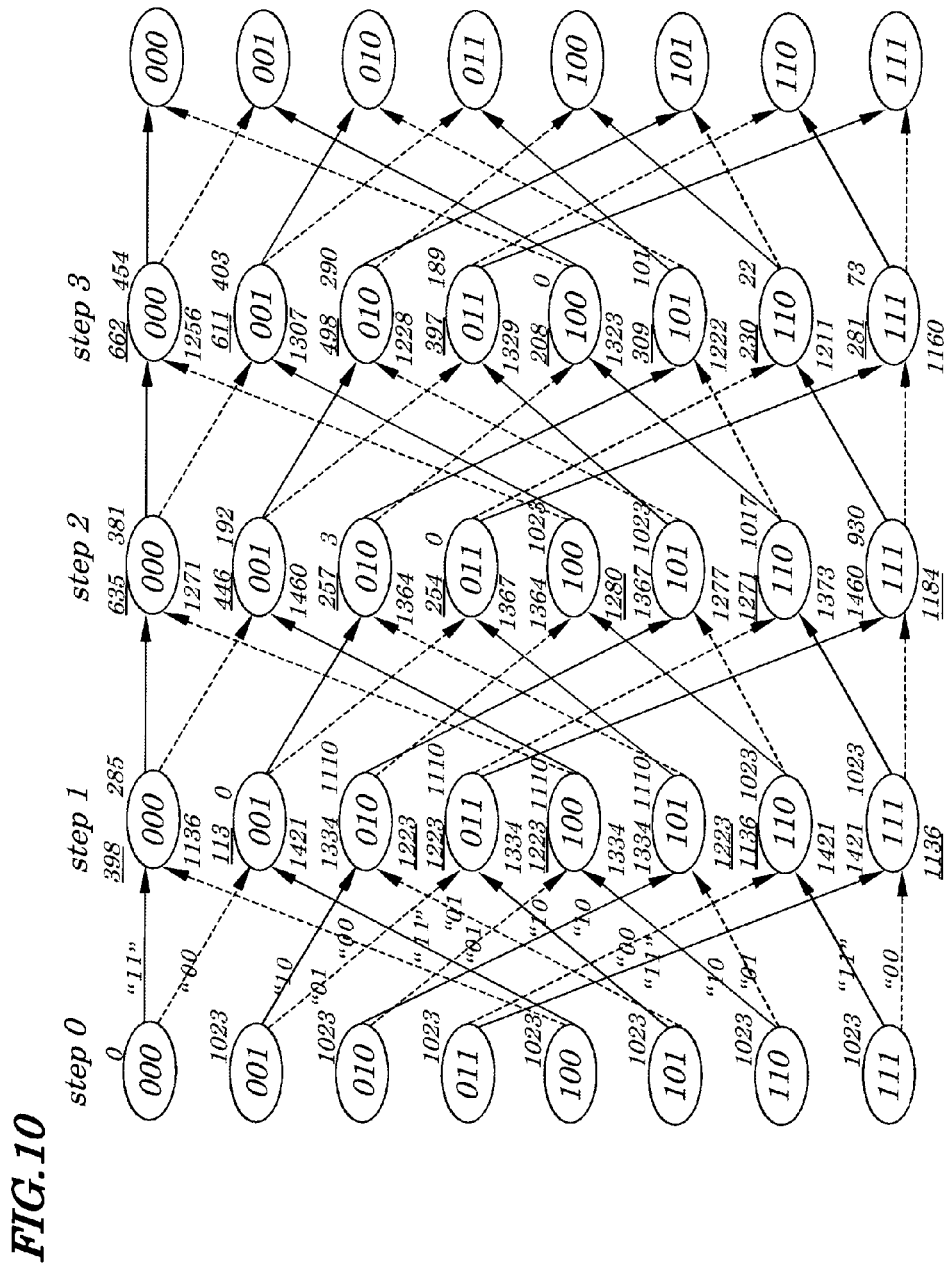
FIG. 10 is a trellis diagram of using a minimum value selecting method employed in the second embodiment of the present invention.

FIG. 9 is a trellis diagram of using a maximum value selecting method and FIG. 10 is a trellis diagram of using the minimum value selecting method employed in the second embodiment of the present invention. In FIG. 9 and FIG. 10, each of numerals "00", "11", "01" and "10" shown on the right side of Step 0 represents a symbol sequence (systematic bits and parity bits) making up a codeword, each of numerals shown on the left on each of ellipses represents each path metric value and each of underlined numerals out of numerals shown on the left on each of the ellipses represents a path metric value selected as a result from the ACS operation. Moreover, each of numerals shown on the right on each of the ellipses represents a result obtained by performing truncation (described later) on a path metric value selected as the result of the ACS operation.

In the minimum value selecting method, a branch metric value calculated based on a correlation value between a symbol sequence making up a codeword obtained by reversing "0" and "1" and a symbol sequence of a received word and on an extrinsic information value, represents an opposite of a likelihood of a received word to a codeword and the smaller the branch metric value is, the greater the likelihood becomes. Therefore, in the minimum value selecting method, a path having a minimum path metric value becomes a maximum likelihood path. Moreover, an initial value of the path metric value in the minimum value selecting method is different from that in the maximum value selecting method. That is, in the maximum value selecting method, in order not to select a wrong path in the ACS operation, a sufficiently large value is given as an initial value of a state "000" and "0" being a minimum value is given as an initial value of other states "001" to "111". In the minimum value selecting method, "0" being a minimum value is given to a state "000" and a sufficiently large value is given to other states "001" to "111". This eliminates a possibility of selecting a wrong path in the minimum value selecting method.

Figure 11:
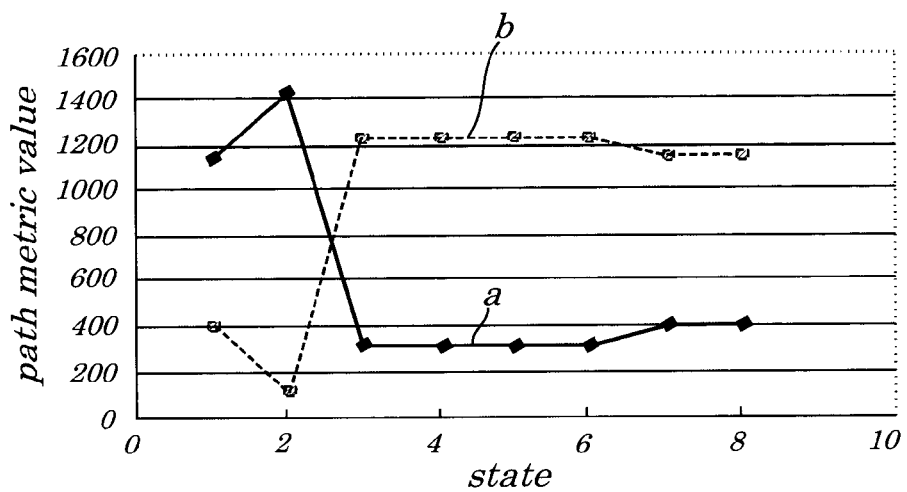
FIG. 11 is a diagram of path metric values plotted for each state existing before truncation in Step 0 in the maximum value selecting method employed in the conventional technology and in the minimum value selecting method employed in a third embodiment of the present invention.
Figure 12:
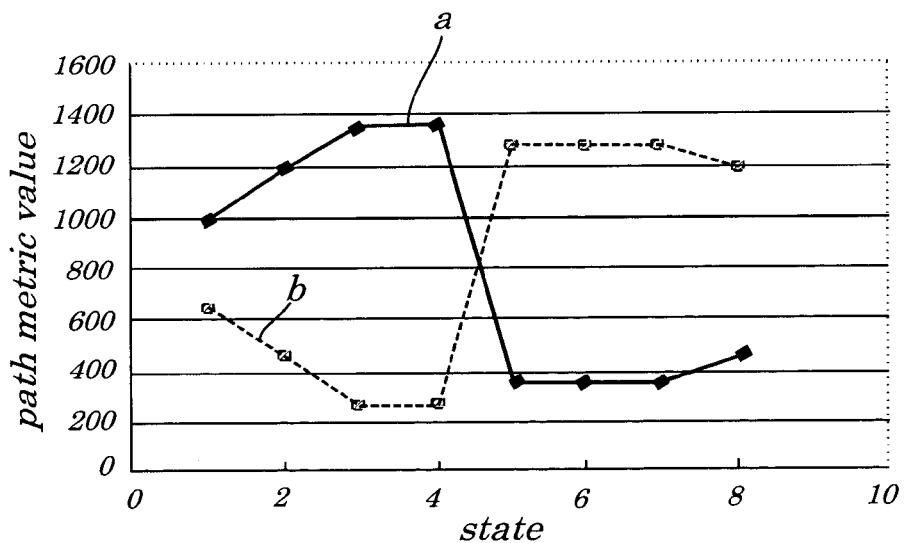
FIG. 12 is a diagram of path metric values plotted for each state existing before truncation in Step 1 in the maximum value selecting method employed in the conventional technology and in the minimum value selecting method employed in the third embodiment of the present invention.
Figure 13:
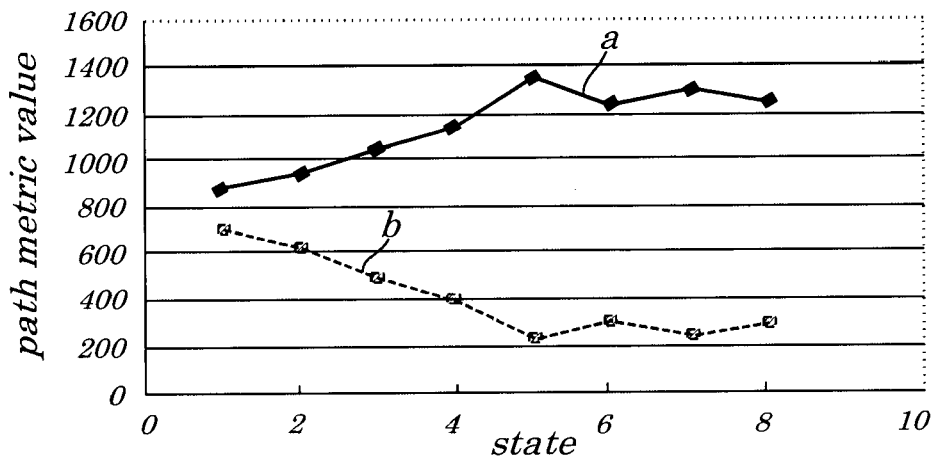
FIG. 13 is a diagram of path metric values plotted for each state existing before truncation in Step 2 in the maximum value selecting method employed in the conventional technology and in the minimum value selecting method employed in the third embodiment of the present invention.
Figure 14:
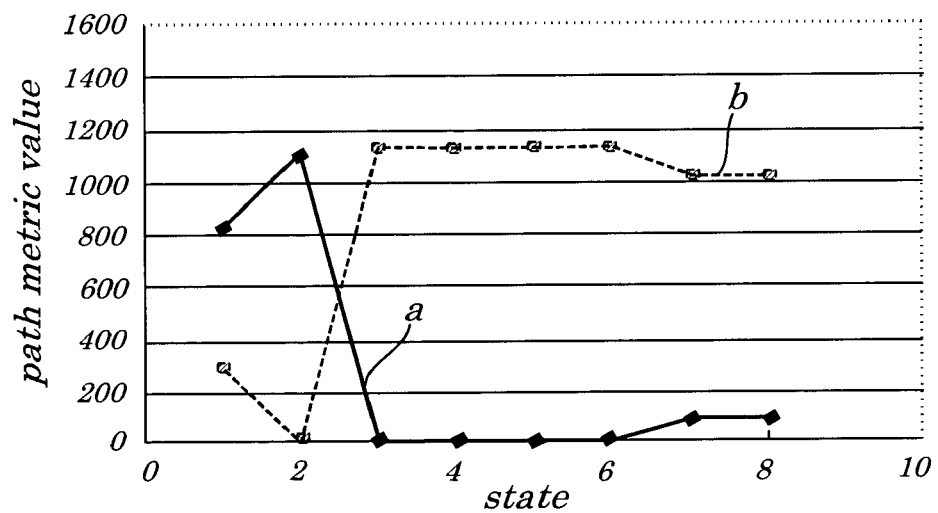
FIG. 14 is a diagram of path metric values plotted for each state existing after truncation in Step 0 in the maximum value selecting method employed in the conventional technology and in the minimum value selecting method employed in the third embodiment of the present invention.
Figure 15:
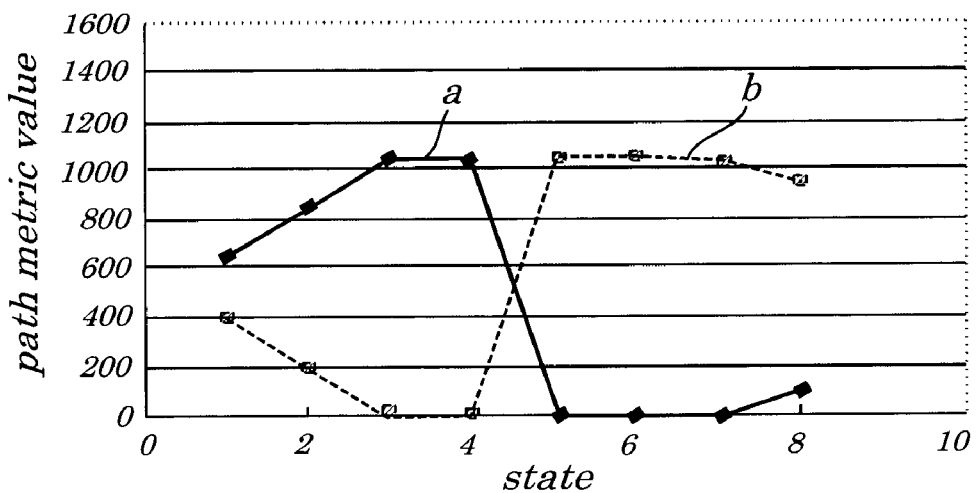
FIG. 15 is a diagram of path metric values plotted for each state existing after truncation in Step 1 in the maximum value selecting method employed in the conventional technology and in the minimum value selecting method employed in the third embodiment of the present invention.
Figure 16:
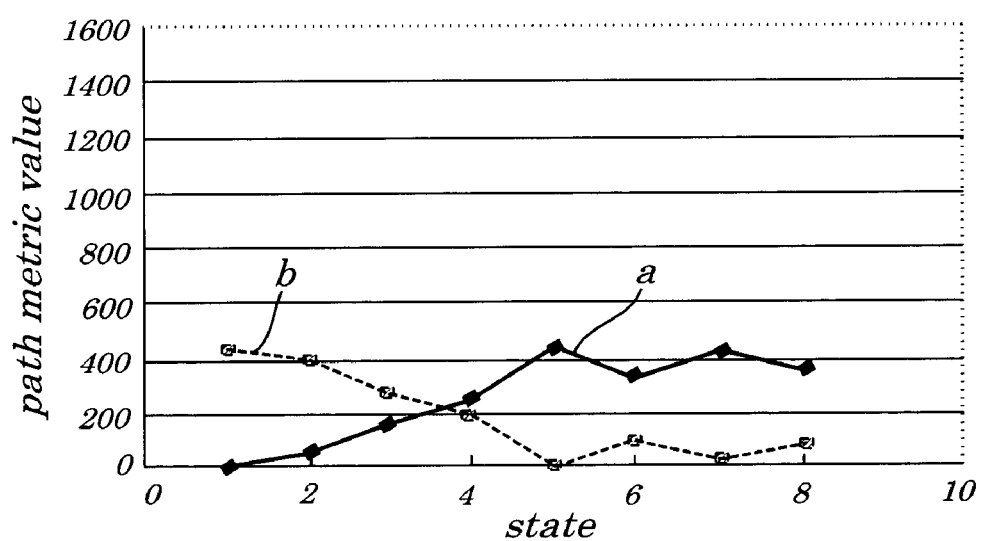
FIG. 16 is a diagram of path metric values plotted for each state existing after truncation in Step 2 in the maximum value selecting method employed in the conventional technology and in the minimum value selecting method employed in the third embodiment of the present invention.
Figure 17:
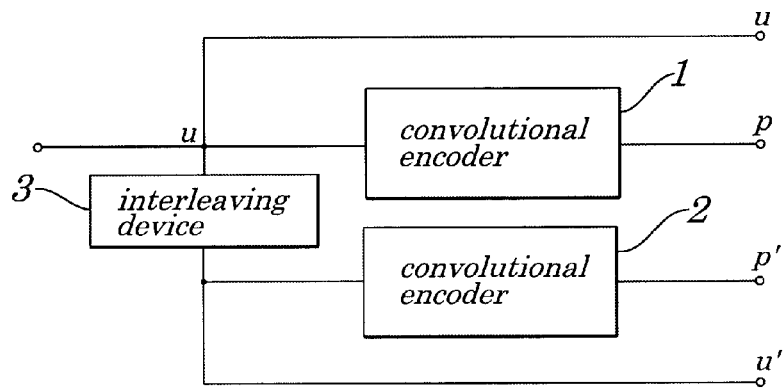
FIG. 17 is a schematic block diagram of a configuration of an conventional encoder of Turbo codes, which is used to explain the prior art.
Figure 18:
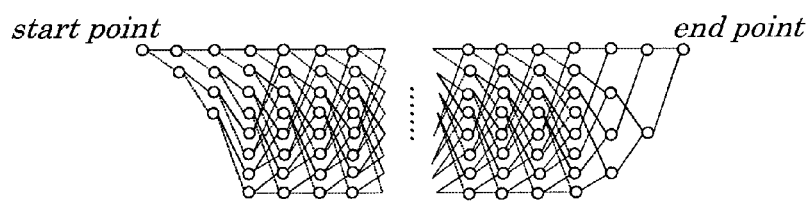
FIG. 18 is a diagram of a trellis diagram, which is used to explain the prior art.
Figure 19:
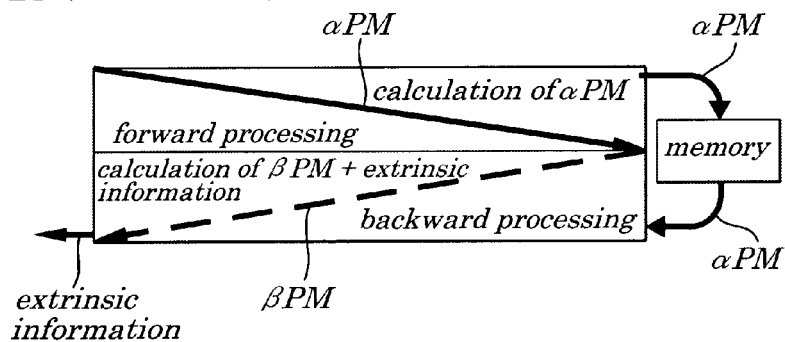
FIG. 19 is a diagram of a procedure of ordinary decoding, which is used to explain the prior art, which is used to explain the prior art.
Figure 20:
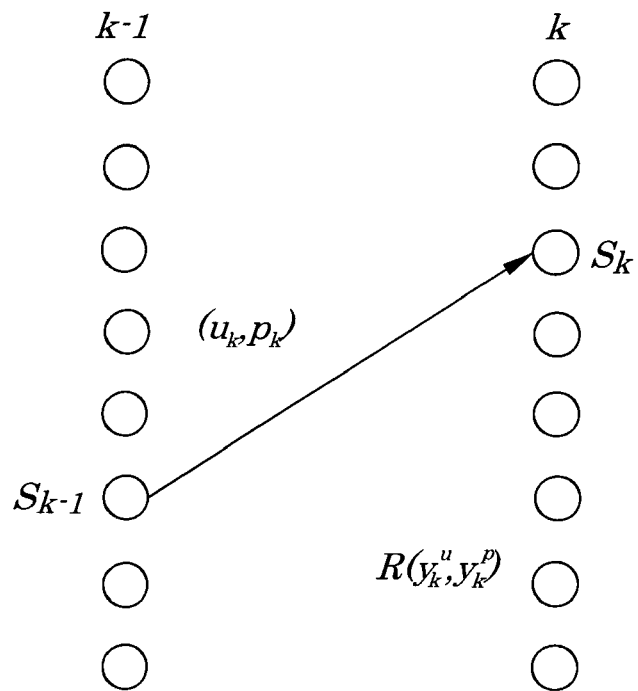
FIG. 20 is a diagram of a transition model in a case when transition from a time point (k−1) to a time point k on a trellis diagram takes place, which is used to explain the prior art.
Figure 21:
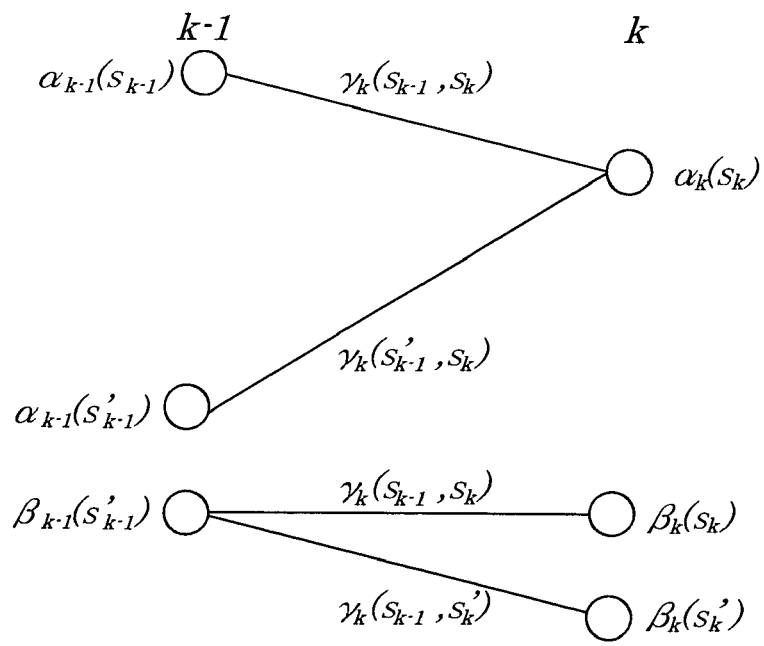
FIG. 21 is a diagram of a calculation model of $\alpha_{K-1}(s_{K-1})$ and $\beta_k(s_K)$ in a case where a transition from the time (k−1) to the time k on the trellis diagram takes place, which is used to explain the prior art.

FIGS. 11, 12, 13 are diagrams illustrating path metric values plotted for each state existing before truncation in Steps 0, 1, 2 in the maximum value selecting method employed in the conventional technology and in the minimum value selecting method employed in the third embodiment of the present invention. FIGS. 14, 15, 16 are diagrams illustrating path metric values plotted for each state existing after truncation in Steps 0, 1, and 2 in the maximum value selecting method employed in the conventional technology and in the minimum value selecting method employed in the third embodiment of the present invention. The truncation represents processing of subtraction to obtain a minimum value. In FIG. 11 to FIG. 16, a curve "a" represents path metric values plotted according to the maximum value selecting method and a curve "b" represents path metric values plotted according to the minimum value selecting method. FIGS. 11 and 14 show path metric values in Step 0, FIGS. 12 and 15 show path metric values in Step 1, and FIGS. 13 and 16 show path metric values in Step 2.

As shown in FIGS. 11 to 13, the curve "b" for the minimum value selecting method and the curve "a" for the maximum value selecting method are symmetrical with respect to a line being parallel to a horizontal axis. In the maximum value selecting method, a path metric value of a path having a likelihood is set to be a maximum while, in the minimum value selecting method, a path metric value of a path having a likelihood is set to be a minimum. This enables an ideal truncation processing. That is, a soft-output value providing an origin of an extrinsic information value can be obtained as a difference between a probability being the most likely to "0" and a probability being the most likely to "1". Therefore, an important thing is not a path metric value in each state but differential information. As a result, an extrinsic information value calculated according to the maximum value selecting method and to minimum value selecting method is the same and no difference in decoding characteristics exists. Moreover, configurations of the decoder of Turbo codes employed in the first and second embodiments, that is, configurations shown in FIG. 1 and FIG. 7 can be used in the decoder of Turbo codes of the third embodiment.

It is apparent that the present invention is not limited to the above embodiments but may be changed and modified without departing from the scope and spirit of the invention. For example, the present invention can be applied to a decoder which performs iterative decoding on codes using convolutional codes by an MAP-type soft-input and soft-output decoding.

In each of the above embodiments, an example is shown in which each component is hardware structured, however, the present invention is not limited to this. That is, the decoder of error correcting codes of the present invention may be made up of a computer having a processor (arithmetic operation device), an internal storage device such as a Read-Only-Memory (ROM), Random Access Memory (RAM) or a like, an external storage device such as an Flexible Disk Driver (FDD), Hard Disk Driver (HDD), Compact Disk ROM (CD-ROM) driver or a like, output devices, and input devices. Moreover, the forward processing module 21, backward processing module 22, forward processing and backward processing shared-use module 31, and extrinsic information value calculating modules 23 or 32 of the decoder of the present invention are configured so that it is made up of a processor and so that functions of these modules are saved as decoding programs in semiconductor memories such as a ROM or a like, storage media such as an floppy disk (FD), HDD, CD-ROM or a like. In this case, the above internal storage devices or external storage devices serve as the above memories 24 to 28 or memories 33 to 37 and a decoding program of error correcting codes is read into a processor from a storage medium to control operations of the processor. This processor, when the decoding program of error correcting codes is started, operates to function as the forward processing module 21, backward processing module 22, forward processing and backward processing shared-use module 31, extrinsic information value calculating modules 23 or 32 as employed in the present invention and, under the decoding program of error correcting codes, performs the processing described above. By configuring as above, since such the learning processing as described above is made unnecessary, it is possible to reduce an amount of arithmetic operations to be performed by the processor. Since an amount of arithmetic operations in the forward processing, backward processing, extrinsic information processing, and learning processing is almost the same, the amount of arithmetic operations can be reduced to three-fourth or less the amount of the conventional arithmetic operations. As a result, capacity of a memory device, memory capacity of an instruction memory to store instructions in particular and currents consumed by a computer can be reduced and processing time can be also shortened.

What is claimed is:

1. A decoding method based on a trellis diagram including first and second states, said second state being a state subsequent to said first state, said decoding method comprising:
generating a first codeword having a first symbol sequence, said first codeword being output from an encoder in a data transmitting side;
inverting logic levels of said first symbol sequence of said first codeword to produce a second codeword having a second symbol sequence; and
calculating a branch metric value corresponding to state transition from said first state to said second state by using a correlation value between a symbol sequence of a received word and said second symbol sequence of said second codeword.

2. The decoding method according to claim 1, further comprising:
calculating path metric value corresponding to said second state based on said branch metric value; and
subtracting predetermined value from said path metric value.

3. The decoding method according to claim 1, further comprising:
selecting a path on said trellis diagram as a maximum likelihood path, said selected path having a minimum path metric value, said path metric value being calculated based on said branch metric value, wherein the higher a correlation between said second codeword and said received word is, the greater said correlation value becomes.

4. The decoding method according to claim 1, wherein one of a plurality of initial states on said trellis diagram is given an initial path metric value and other said initial states are given different initial path metric values, each of said different initial path metric values being higher than said initial path metric value.

5. The decoding method according to claim 4, wherein said initial path metric value is a value "0".

6. The decoding method according to claim 1, further comprising:
forward processing to calculate a first path metric value by performing Viterbi decoding in a direction from a start point to an end point on said trellis diagram, based on received data and an extrinsic information value;
backward processing to calculate a second path metric value by performing said Viterbi decoding for every window on said trellis diagram in a direction being reverse to said direction applied to said forward processing, based on said received data and said extrinsic information value;
extrinsic information value calculating to calculate said extrinsic information value, based on said first and second path metric values;
wherein, in said forward processing and said backward processing, said Viterbi decoding is performed using said trellis diagram, wherein symbol values making up a codeword are inverted and in which a path having a minimum path metric value is selected; and
wherein, for a subsequent iteration of said backward processing, decoding is performed using, as an initial value of the second path metric value for a window boundary, the second path metric value obtained at the window boundary in a preceding iteration.

7. The decoding method according to claim 6, wherein said extrinsic information value is multiplied by a normalized coefficient within a range of 0.5 to 0.9.

8. The decoding method according to claim 6, wherein a channel constant to be used to calculate said extrinsic information value is within a range of 1.5 to 2.5.

9. The decoding method according to claim 6, wherein a size of said window is at least four times larger than the code constraint length and is no larger than half a maximum length of a codeword.

10. The decoding method according to claim 1, further comprising:
forward processing to calculate a first path metric value by performing Viterbi decoding in a direction from a start point to an end point on a trellis diagram, based on received data and an extrinsic information value;
backward processing to calculate a second path metric value by performing said Viterbi decoding for every window on said trellis diagram in a direction being reverse to said direction applied to said forward processing, based on said received data and said extrinsic information value;
extrinsic information value calculating to calculate said extrinsic information value based on said first and second path metric values;
wherein, in said forward processing and said backward processing, said Viterbi decoding is performed using said trellis diagram, wherein symbol values making up a codeword are inverted and in which a path having a minimum path metric value is selected; and
wherein, in a subsequent iteration of said forward processing, decoding is performed by using, as an initial value of the first path metric value for a window boundary, the first path metric value obtained for the window boundary in a preceding iteration; and
wherein, in a subsequent iteration of said backward processing, decoding is performed using, as an initial value of the second path metric value for a window boundary, the second path metric value obtained for the window boundary in a preceding iteration.

11. The decoding method according to claim 10, wherein said extrinsic information value is multiplied by a normalized coefficient within a range of 0.5 to 0.9.

12. The decoding method according to claim 10, wherein a channel constant to be used to calculate said extrinsic information value is within a range of 1.5 to 2.5.

13. The decoding method according to claim 10, wherein a size of said window is at least four times larger than the code constraint length and is no larger than half a maximum length of a codeword.

14. A decoding method based on a trellis diagram including first and second states, said second state being a state subsequent to said first state, said decoding method comprising:
generating a first codeword having a first symbol sequence;
inverting logic levels of said first symbol sequence of said first codeword to produce a second codeword having a second symbol sequence; and
calculating a branch metric value corresponding to state transition from said first state to said second state by using a symbol sequence of a received word and said second symbol sequence of said second codeword.

15. The decoding method according to claim 14, wherein said first codeword is generated by performing an encode.

16. The decoding method according to claim 14, wherein said first codeword is generated in a data transmitting side.

* * * * *